US011222678B1

(12) United States Patent
Parkinson et al.

(10) Patent No.: US 11,222,678 B1
(45) Date of Patent: Jan. 11, 2022

(54) MRAM CROSS-POINT MEMORY WITH REVERSED MRAM ELEMENT VERTICAL ORIENTATION

(71) Applicant: SanDisk Technologies LLC, Addison, TX (US)

(72) Inventors: Ward Parkinson, Boise, ID (US); James O'Toole, Boise, ID (US); Nathan Franklin, Belmont, CA (US); Thomas Trent, Tucson, AZ (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/061,836

(22) Filed: Oct. 2, 2020

(51) Int. Cl.
*G11C 11/16* (2006.01)
*H01L 27/22* (2006.01)

(52) U.S. Cl.
CPC ...... *G11C 11/1673* (2013.01); *G11C 11/1655* (2013.01); *G11C 11/1657* (2013.01); *G11C 11/1675* (2013.01); *H01L 27/228* (2013.01)

(58) Field of Classification Search
CPC ............ G11C 11/1673; G11C 11/1675; G11C 11/1655; G11C 11/1657; H01L 27/228
See application file for complete search history.

(56) References Cited

U.S. PATENT DOCUMENTS

| | | | |
|---|---|---|---|
| 7,339,811 B2 | 3/2008 | Nejad et al. | |
| 8,004,881 B2 * | 8/2011 | Zhu | G11C 11/1675 365/158 |
| 8,565,003 B2 | 10/2013 | Siau | |
| 9,704,919 B1 * | 7/2017 | Lu | H01L 21/31111 |
| 9,741,764 B1 * | 8/2017 | Terai | H01L 27/2481 |
| 10,373,682 B2 | 8/2019 | Parkinson et al. | |
| 10,403,343 B2 * | 9/2019 | Bozdag | G11C 11/1675 |
| 10,497,438 B2 | 12/2019 | Choi et al. | |
| 10,545,692 B2 | 1/2020 | Franklin et al. | |
| 10,600,478 B2 * | 3/2020 | Tzoufras | H01L 43/02 |

* cited by examiner

*Primary Examiner* — Tri M Hoang
(74) *Attorney, Agent, or Firm* — Vierra Magen Marcus LLP

(57) ABSTRACT

In a memory array with a cross-point structure, at each cross-point junction a programmable resistive memory element, such as an MRAM device, is connected in series with a threshold switching selector, such as an ovonic threshold switch. In a two-layer cross-point structure with such memory cells, the MRAM devices in one layer are inverted relative to the MRAM devices in the other layer. This can allow for the transient voltage spike placed across the MRAM device when the threshold switching selector first turns on in a sensing operation to dissipate more rapidly, reducing the risk of changing a stored data state before it can be sensed.

20 Claims, 28 Drawing Sheets

MRAM CROSS-POINT MEMORY WITH REVERSED MRAM ELEMENT VERTICAL ORIENTATION

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, it is challenging to achieve high bit density and high endurance for fast write operations with previous MRAM memory cell designs.

BRIEF DESCRIPTION OF THE DRAWING

Like-numbered elements refer to common components in the different figures.

DETAILED DESCRIPTION

Figure 1:
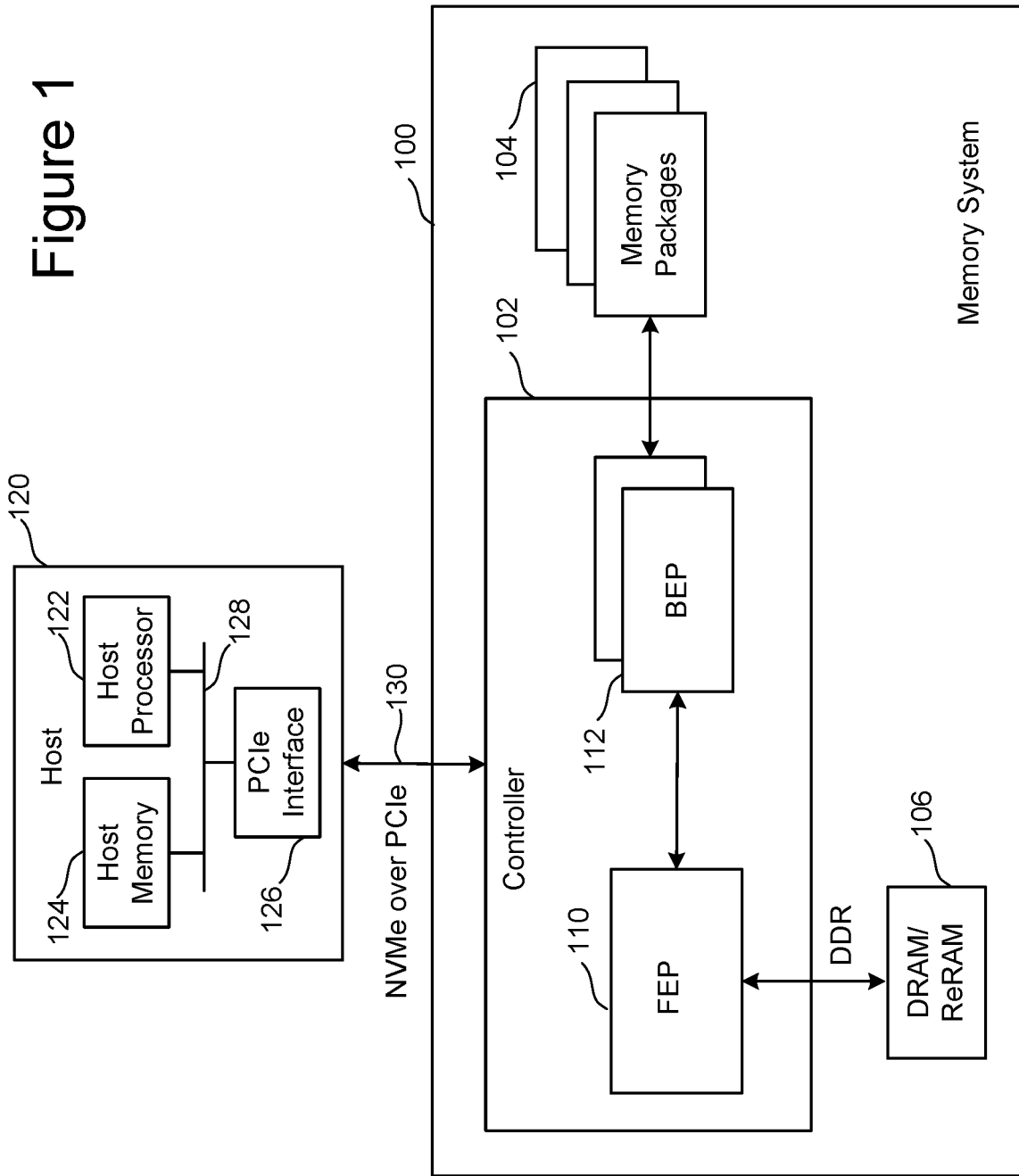
FIG. 1 is a block diagram of one embodiment of a memory system connected to a host.

In a memory array with a cross-point type architecture, a first set of conductive lines run across the surface of a substrate and a second set of conductive lines are formed over the first set of conductive lines, running over the substrate in a direction perpendicular to the first set of conductive lines. The memory cells are located at the cross-point junctions of the two sets of conductive lines. Embodiments for the memory cells can include a programmable resistance element, such as an MRAM memory device, connected in series with a selector switch. One type of selector switch is threshold switching selector, such as an ovonic threshold switch (OTS), that can be implemented in a small amount of area, and without need of an additional control line, relative to other switching elements, such as a transistor. If a voltage or current is above a certain level, the threshold voltage ($V_{th}$) or threshold current ($I_{th}$), is applied across or through a threshold switching selector, it will switch to a conducting state, a $V_{hold}$ in series with a resistance. When the threshold switching selector initially turns on, a transient voltage spike is placed across the series-connected MRAM device since the $V_{hold}$ may be less than $V_{th}$, especially since a higher Vth (by thickening the selector) results in lower leakage. And lower $V_{hold}$ results in more available write current for a given power supply, such as 3.3V. This transient current may be briefly more than the $I_{read}$ or $I_{write}$ that may change the state of the memory cell before it can be sensed, resulting in a disturb. The risk of such a disturb can be reduced, and a sensing operation be performed sooner, by more quickly dissipating the transient voltage spike, such as by reducing the cell, line, and transistor select and driver capacitance connected to the selected memory bit.

In a cross-point architecture with two or more memory cell layers, the MRAM devices of each layer would be typically formed with the same vertical orientation of the MRAM device's layers. MRAM devices have a directionality, where when using the spin transfer torque for writing the memory cell, current applied in one direction is used to write the MRAM device from a high resistance anti-parallel state (HRS or AP) to a low resistance state parallel (LRS or P) and applied in the opposite direction to write the MRAM device from the low resistance state to the high resistance state. Because of this directionality, there is also often a preferred direction for applying a read current when sensing a memory cell since more current for longer time may be required to write the bit from P to AP. With the memory cells of the different layers having the same orientation, one of these layers is able to more rapidly discharge the transient voltage spike when the threshold switching selector turns on for a read operation since its driver capacitance may be less. By inverting the MRAM structure for one layer relative to the other layer, both layers can be given the orientation that allows this spike to be more rapidly dissipated, reducing the likelihood of altering a stored data state before it is sensed. This may also result in improved read latency access time.

FIG. 1 is a block diagram of one embodiment of a memory system 100 connected to a host 120. Memory system 100 can implement the technology presented herein for operation of a cross-point memory array which have drifted excessively. Many different types of memory systems can be used with the technology proposed herein. Example memory systems include solid state drives ("SSDs"), memory cards including dual in-line memories (DIMMs) for DRAM replacement, and embedded memory devices; however, other types of memory systems can also be used.

Memory system 100 of FIG. 1 comprises a controller 102, non-volatile memory 104 for storing data, and local memory (e.g., DRAM/ReRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In another embodiment, the BEP or FEP is included on the memory die.

Controller 102 communicates with host 120 via an interface 130 that implements a protocol such as, for example, NVM Express (NVMe) over PCI Express (PCIe) or using JEDEC standard Double Data Rate (DDR) or Low-Power Double Data Rate (LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, non-volatile memory, or another type of storage. Host 120 is external to and separate from memory system 100. In one embodiment, memory system 100 is embedded in host 120.

Figure 2:
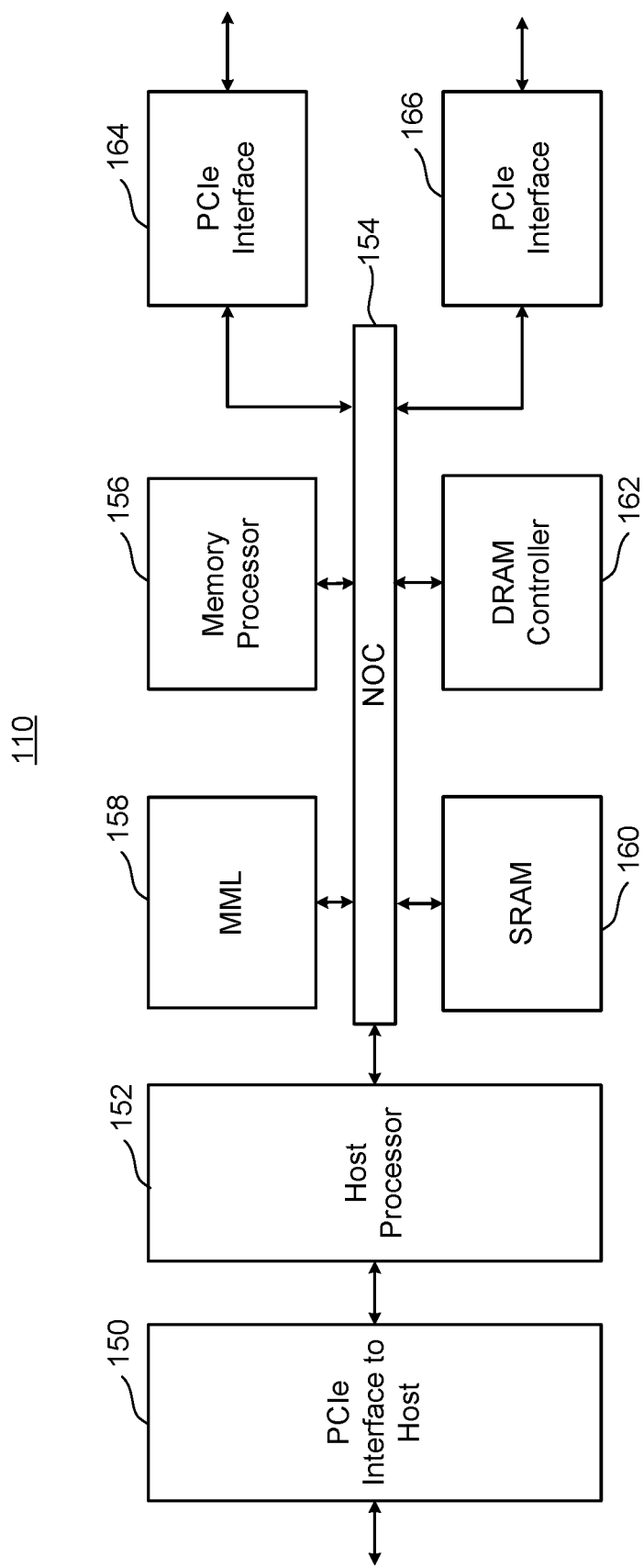
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
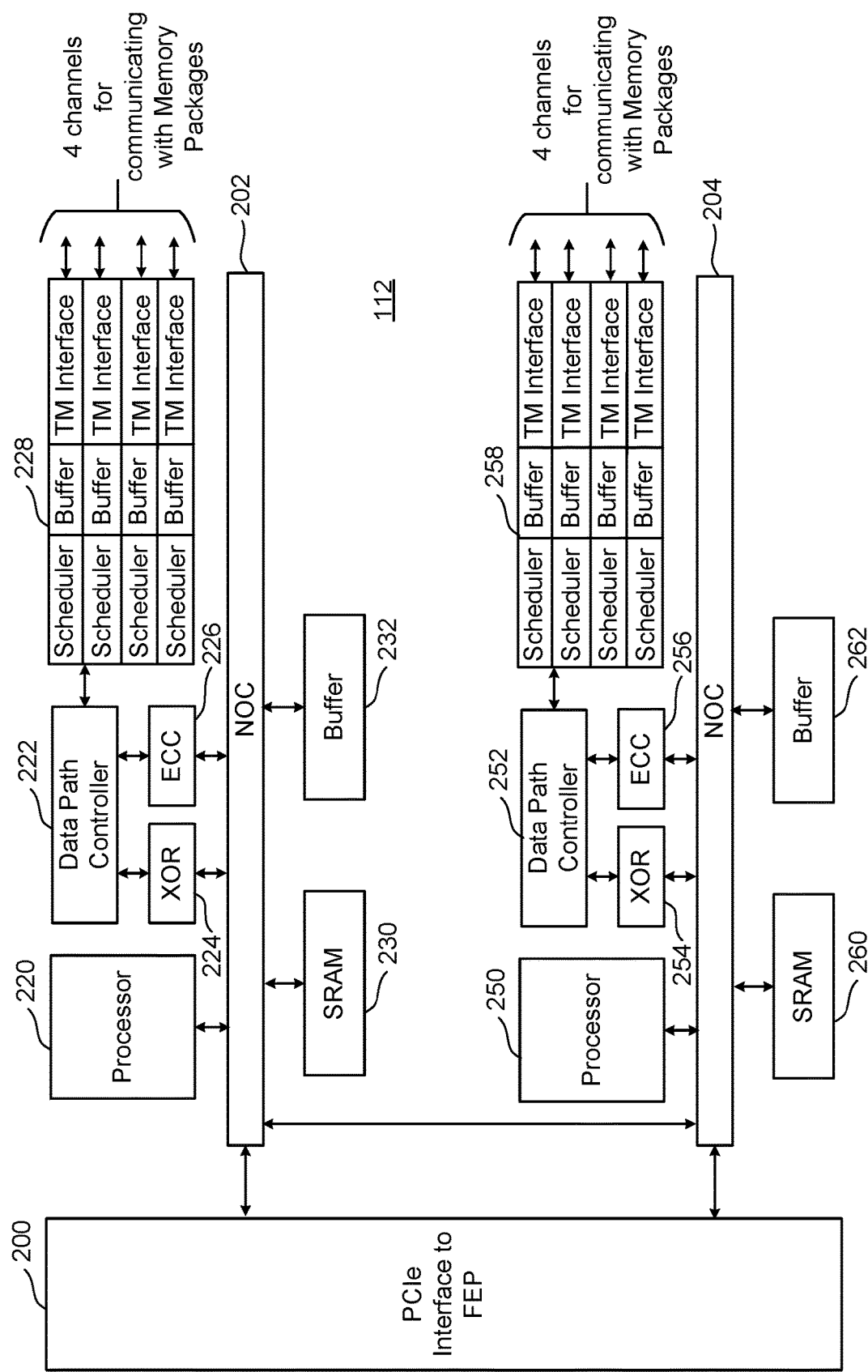
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
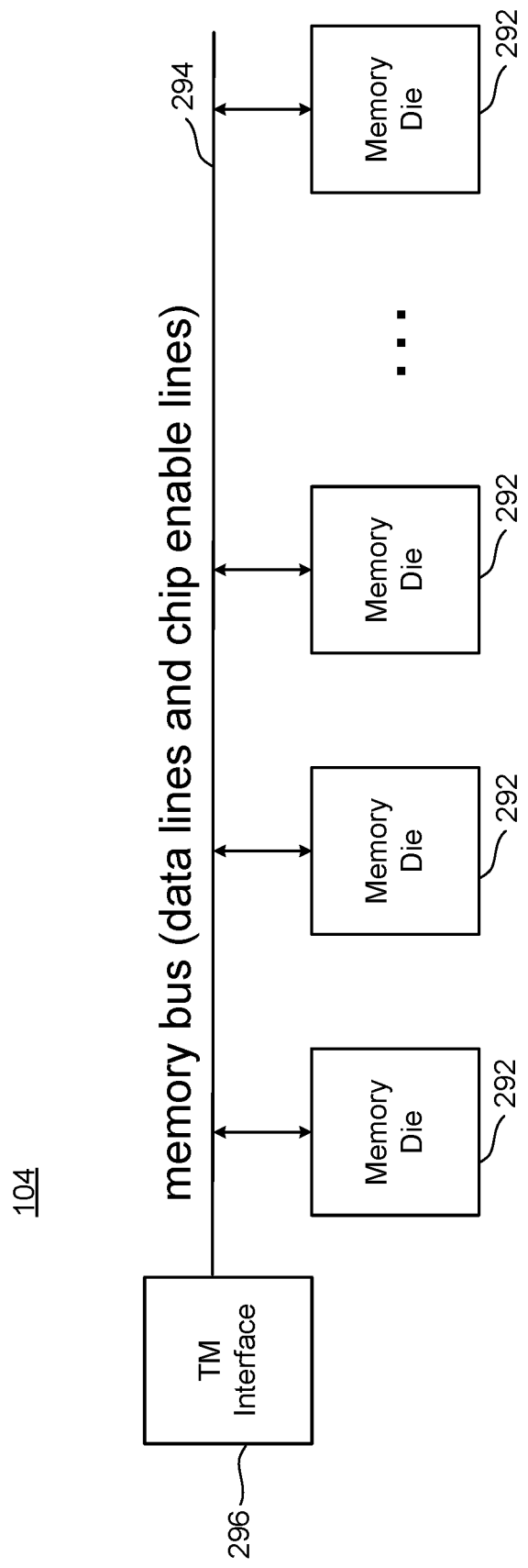
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 5:
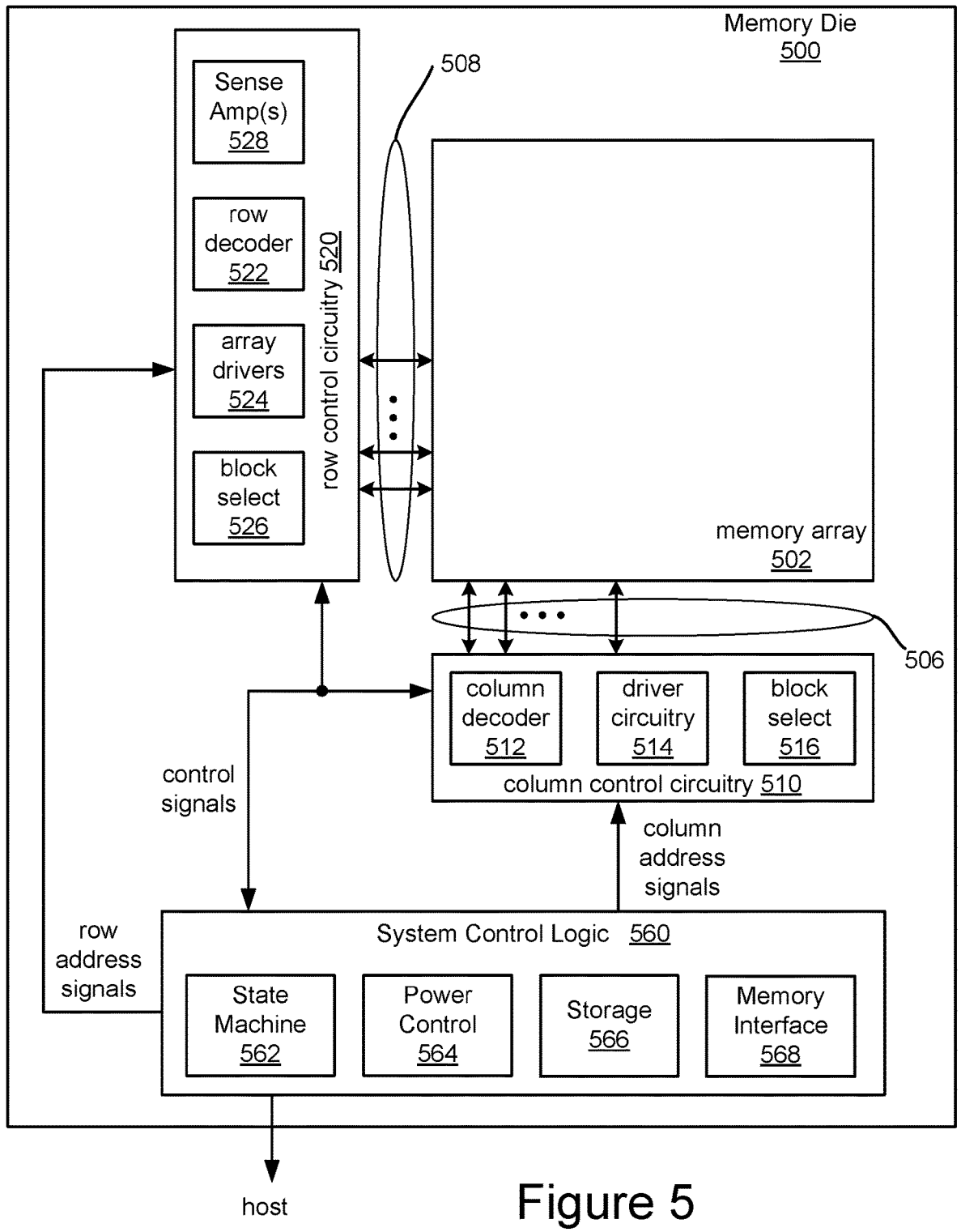
FIG. 5 is a block diagram of one embodiment of a memory die.

FIG. 5 is a block diagram that depicts one example of a memory die 500 that can implement the technology described herein. Memory die 500, which can correspond to one of the memory die 292 of FIG. 4, includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 500 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Row control circuitry 520 may also include read/write circuitry. In an embodiment, row control circuitry 520 has sense amplifiers 528, which each contain circuitry for sensing a condition (e.g., voltage) of a word line of the memory array 502. In an embodiment, by sensing a word line voltage, a condition of a memory cell in a cross-point array is determined. Memory die 500 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor, either on or off the memory chip. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502.

Commands and data are transferred between the controller 102 and the memory die 500 via memory controller interface 568 (also referred to as a "communication interface"). Memory controller interface 568 is an electrical interface for communicating with memory controller 102. Examples of memory controller interface 568 include a Toggle Mode Interface and an Open NAND Flash Interface (ONFI). Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102.

In some embodiments, all of the elements of memory die 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560, or other analogous circuits that are used to control non-volatile memory.

In one embodiment, memory structure 502 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 502 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 502 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
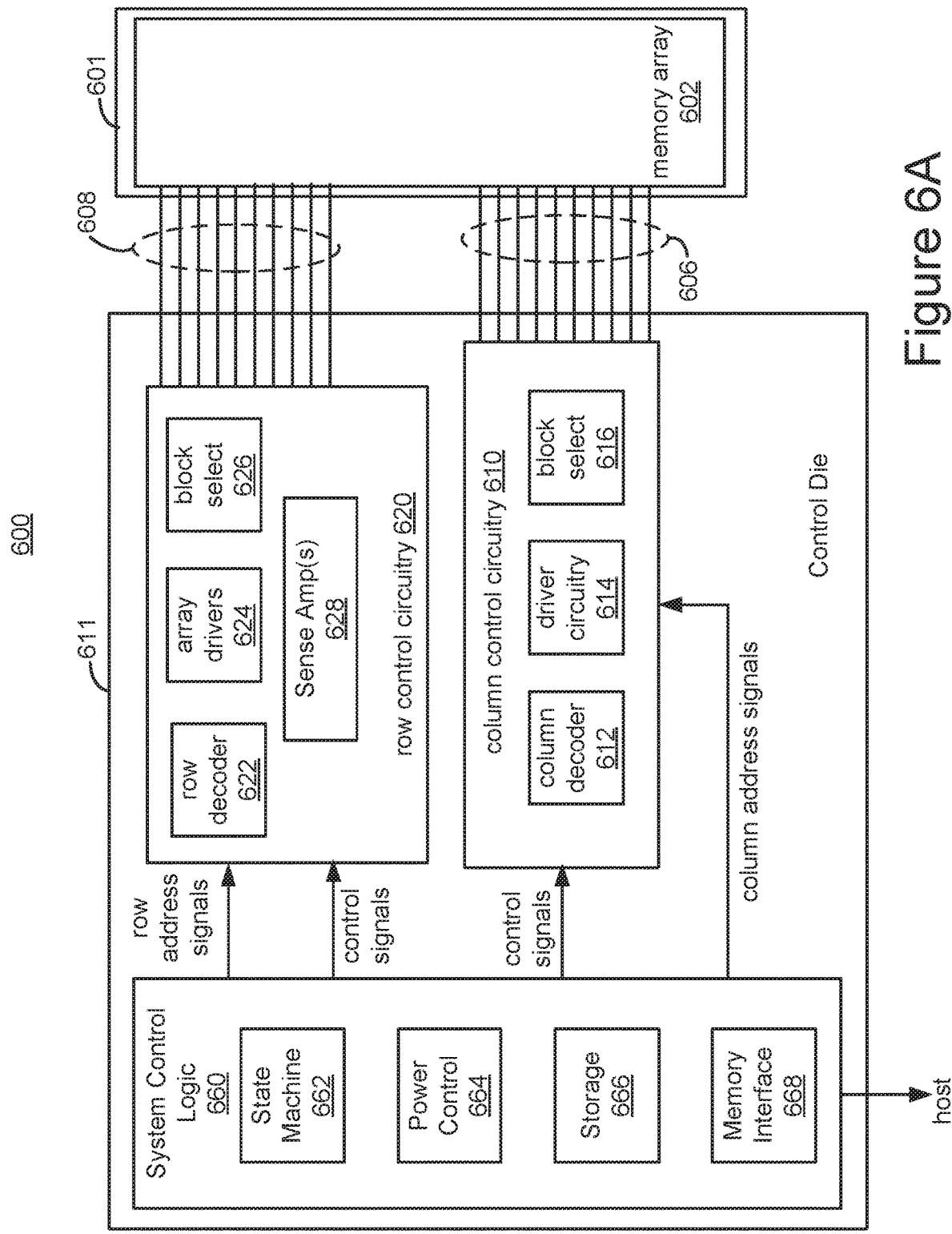
FIGS. 6A and 6B illustrate an example of control circuits coupled to a memory structure through wafer-to-wafer bonding.
Figure 6B:
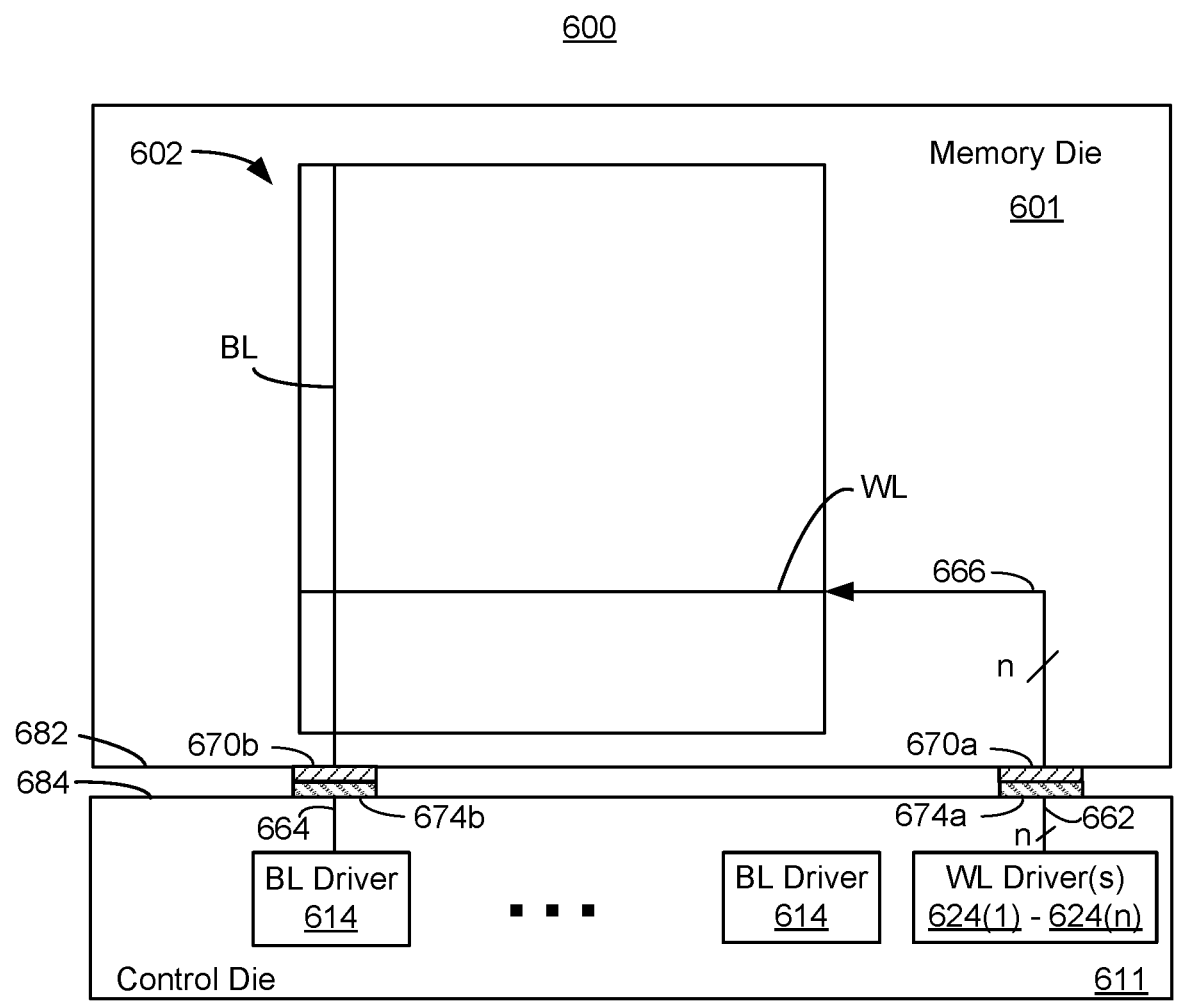

FIGS. 6A and 6B show an alternative arrangement to that of FIG. 5, which may be implemented using wafer-to-wafer bonding to provide a bonded die pair for memory system 600. FIG. 6A shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 660, row control circuitry 620, and column control circuitry 610 are located in control die 611. In some embodiments, all or a portion of the column control circuitry 610 and all or a portion of the row control circuitry 620 are located on the memory structure die 601. In some embodiments, some of the circuitry in the system control logic 660 is located on the on the memory structure die 601.

System control logic 660, row control circuitry 620, and column control circuitry 610 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die 292 may reduce the number of steps needed to fabricate such a die, adding such circuits to a die such as control die 611 may not require any additional process steps.

FIG. 6A shows column control circuitry 610 on the control die 611 coupled to memory structure 602 on the memory structure die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory structure die 601, which are connected to bit lines of memory structure 602. Each bit line of memory structure 602 may have a corresponding electrical path in electrical paths 606, including a pair of bond pads, which connects to column control circuitry 610. Similarly, row control circuitry 620, including row decoder 622, array drivers 624, block select 626, and sense amplifiers 628 are coupled to memory structure 602 through electrical paths 608. Each of electrical path 608 may correspond to a word line, dummy word line, or select gate line. Additional electrical paths may also be provided between control die 611 and memory die 601.

For purposes of this document, the phrase "control circuit" can include one or more of controller 102, system control logic 660, column control circuitry 610, row control circuitry 620, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 5 and 6A will be discussed in the context of a cross-point architecture. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells.

FIG. 6B is a block diagram showing more detail on the arrangement of one embodiment of the integrated memory assembly of bonded die pair 600. Memory die 601 contains a plane or array 602 of memory cells. The memory die 601 may have additional planes or arrays. One representative bit line (BL) and representative word line (WL) 666 is depicted for each plane or array 602. There may be thousands or tens of thousands of such bit lines per each plane or array 602. In one embodiment, an array or plane represents a groups of connected memory cells that share a common set of unbroken word lines and unbroken bit lines.

Control die 611 includes a number of bit line drivers 614. Each bit line driver 614 is connected to one bit line or may be connected to multiple bit lines in some embodiments. The control die 611 includes a number of word line drivers 624(1)-624(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 provide voltages to the word lines in memory die 601. As discussed above with respect to FIG. 6A, the control die 611 may also include charge pumps, voltage generators, and the like that are not represented in FIG. 6B, which may be used to provide voltages for the word line drivers 660 and/or the bit line drivers 614.

The memory die 601 has a number of bond pads 670a, 670b on a first major surface 682 of memory die 601. There may be "n" bond pads 670a, to receive voltages from a corresponding "n" word line drivers 624(1)-624(n). There may be one bond pad 670b for each bit line associated with array 602. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 600. For example, the data bus between the memory controller 102 and the integrated memory assembly 600 may, for example, provide for eight, sixteen, or perhaps 32 bits to be transferred in parallel. However, the data bus between the memory controller 102 and the integrated memory assembly 600 is not limited to these examples.

The control die 611 has a number of bond pads 674a, 674b on a first major surface 684 of control die 611. There may be "n" bond pads 674a, to deliver voltages from a corresponding "n" word line drivers 624(1)-624(n) to memory die 601. There may be one bond pad 674b for each bit line associated with array 602. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 601 to the control die 611. Also, the bond pads 670, 674 permit internal signal transfer between the memory die 601 and the control die 611. Thus, the memory die 601 and the control die 611 are bonded together with bond pads. Although FIG. 6A depicts one control die 611 bonded to one memory die 601, in another embodiment one control die 611 is bonded to multiple memory dies 601.

Herein, "internal signal transfer" means signal transfer between the control die 611 and the memory die 601. The internal signal transfer permits the circuitry on the control die 611 to control memory operations in the memory die 601. Therefore, the bond pads 670, 674 may be used for memory operation signal transfer. Herein, "memory operation signal transfer" refers to any signals that pertain to a memory operation in a memory die 601. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier may be electrically connected to bond pad 674b by pathway 664. Relative to FIG. 6A, the electrical paths 606 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 608 can correspond to the pathway 662, the bond pads 674a, and bond pads 670a. Note that pathways 662 may comprise a separate conductive pathway for each word line driver 624(1)-624(n). Likewise, a there may be a separate bond pad 674a for each word line driver 624(1)-624(n). The word lines in block 2 of the memory die 601 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 5 and 6A will mainly be discussed in the context of a cross-point architecture, although much of the discussion can be applied more generally. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells.

Figure 7A:
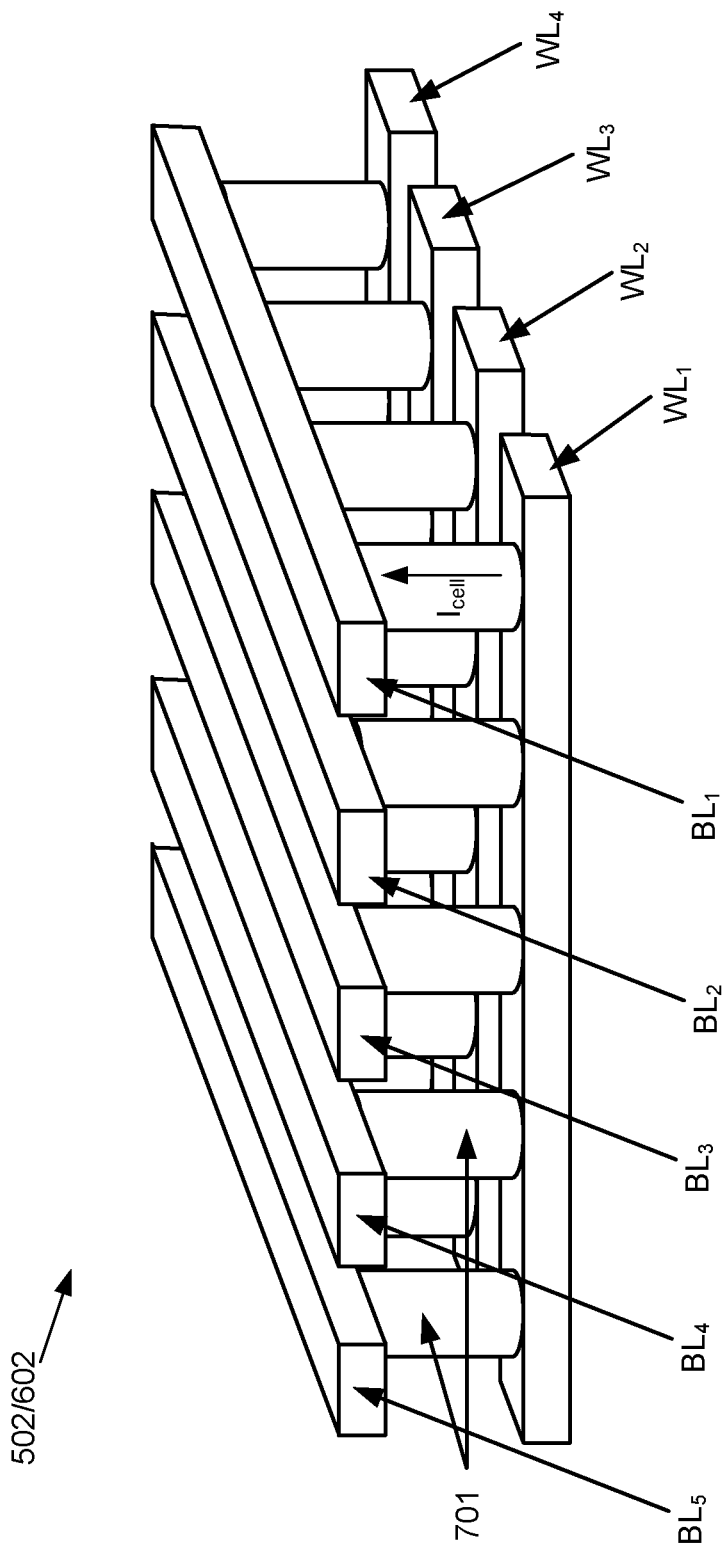
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 5 or 602 in FIG. 6A, where a memory die can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, or other material with a programmable resistance. The following discussion will focus on MRAM memory cells, although much of the discussion can be applied more generally. The current in the memory cells of the first memory level is shown as flowing upward as indicated by arrow $I_{cell}$, but current can flow in either direction, as is discussed in more detail in the following.

Figure 7B:
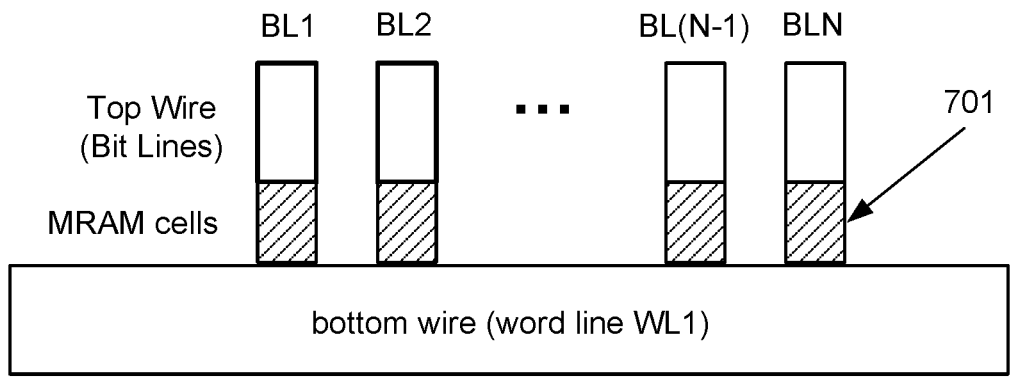
FIGS. 7B and 7C respectively present side and top views of the cross-point structure in FIG. 7A.
Figure 7C:
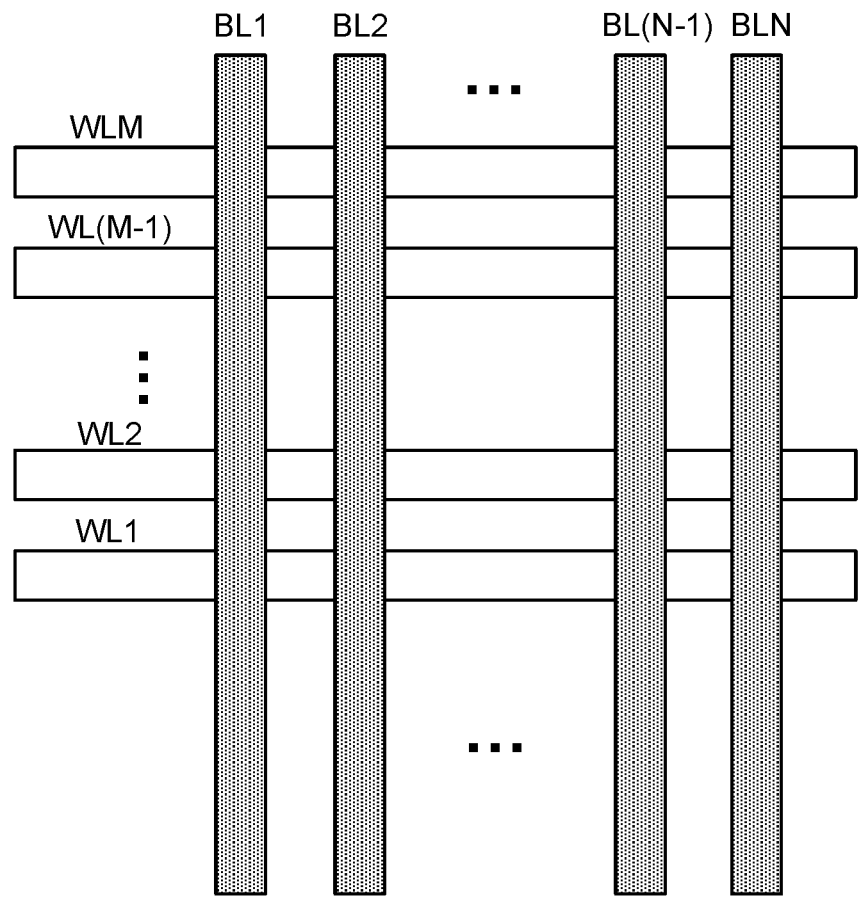

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 1201, although PCM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of at least two resistance states: high and low. More detail on embodiments for an MRAM memory cell design and techniques for their programming are given below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A 2-layer example is illustrated in FIG. 7D.

Figure 7D:
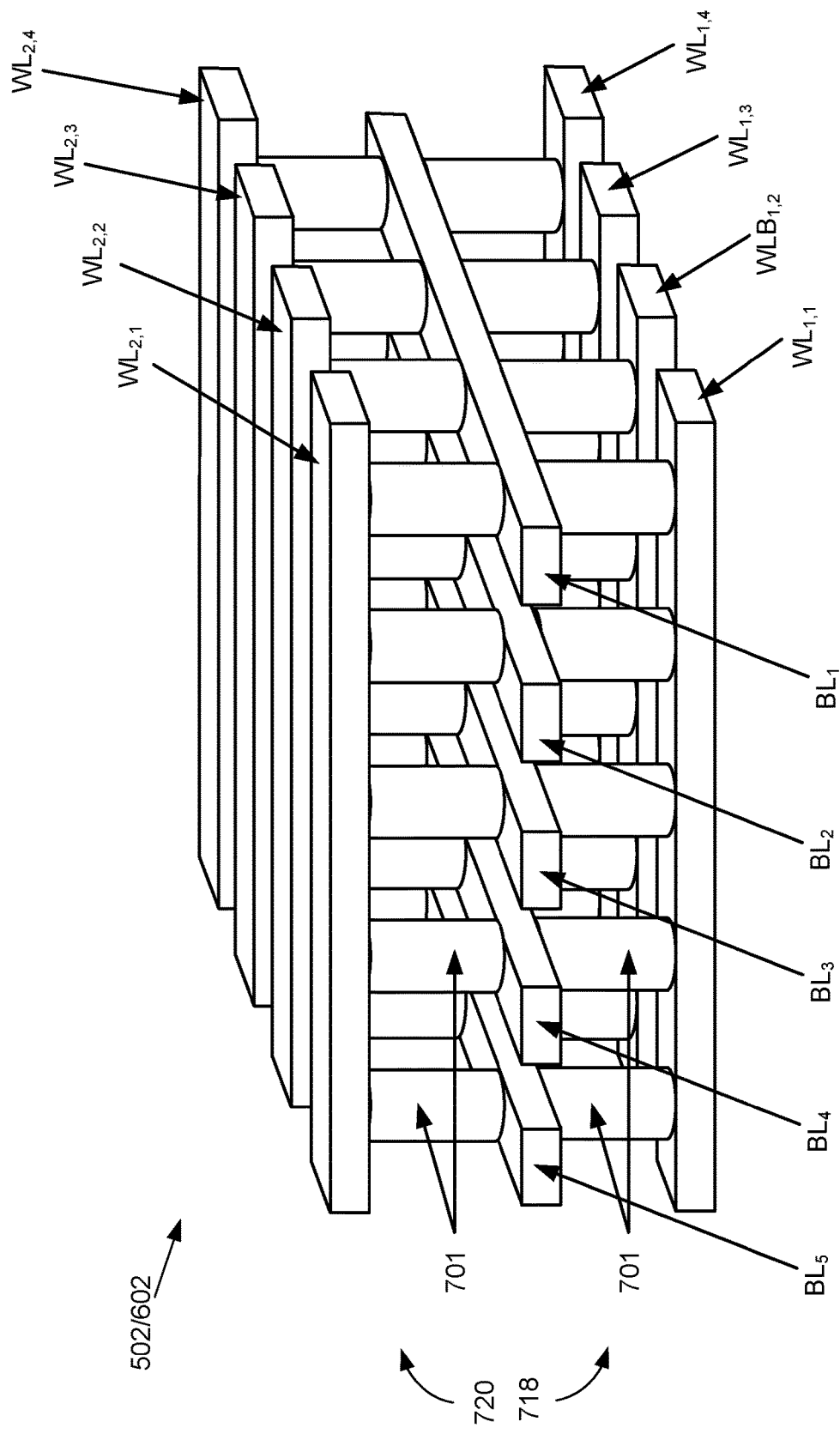
FIG. 7D depicts an embodiment of a portion of a two level memory array that forms a cross-point architecture in an oblique view.

FIG. 7D depicts an embodiment of a portion of a two level memory array that forms a cross-point architecture in an oblique view. As in FIG. 7A, FIG. 7D shows a first layer 718 of memory cells 701 of an array 502/602 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation or to have current flow in the opposite directions.

The use of a cross-point architecture allows for arrays with a small footprint and several such arrays can be formed on a single die. The memory cells formed at each cross-point can a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both. Resistive type memory cells can be formed according to many of the technologies mentioned above, such as ReRAM, FeRAM, PCM, or MRAM. The following discussion is presented mainly in the context of memory arrays using a cross-point architecture with binary valued MRAM memory cells, although much of the discussion is more generally applicable.

Figure 8A:
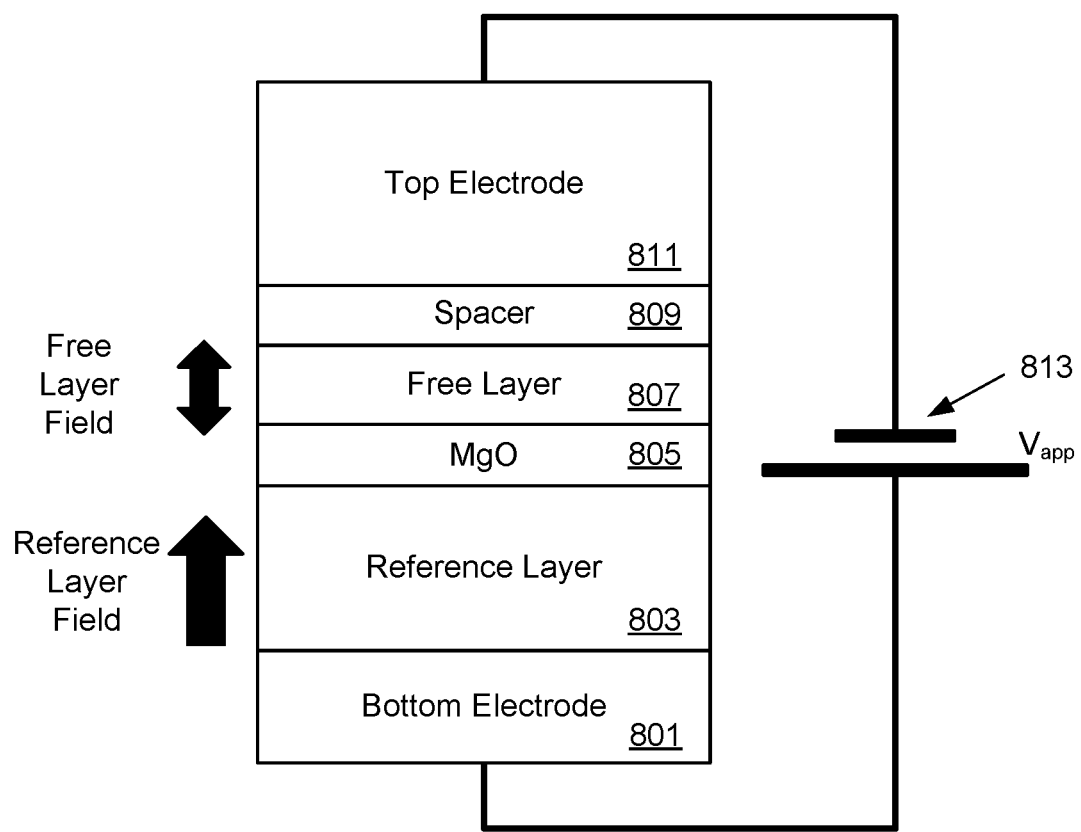
FIGS. 8A and 8B illustrate an embodiments for the structure of an MRAM memory cell.
Figure 8B:
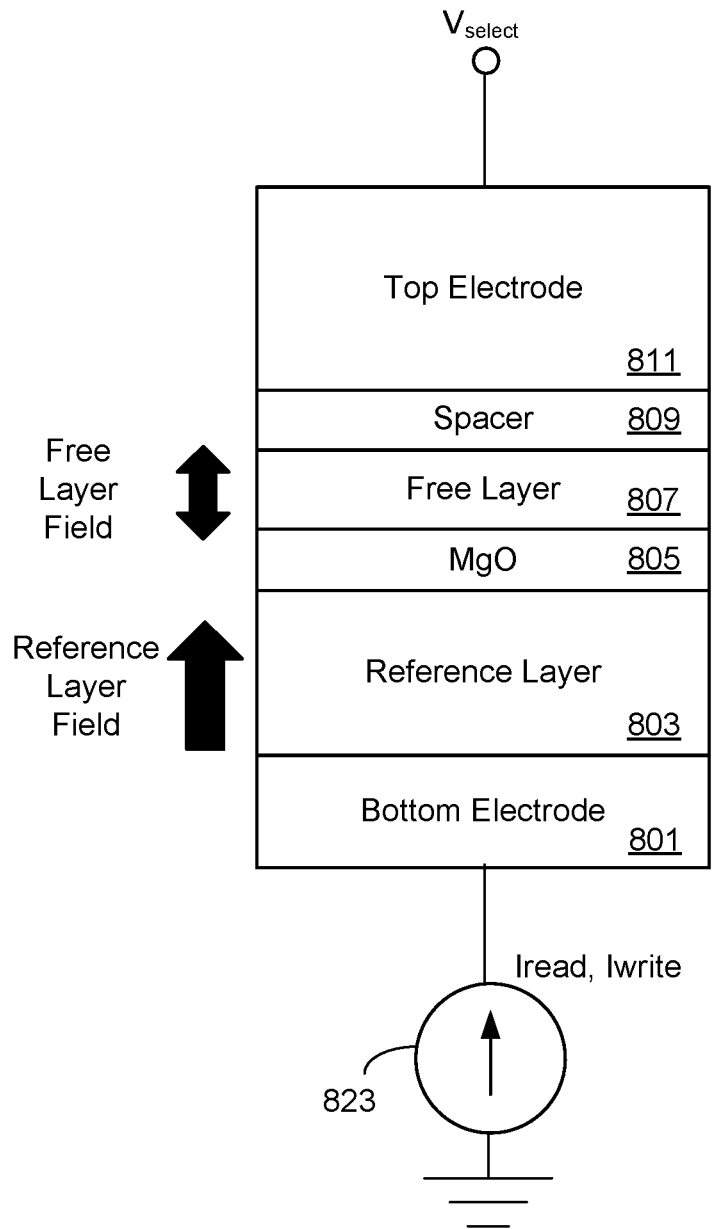
Figure 15:
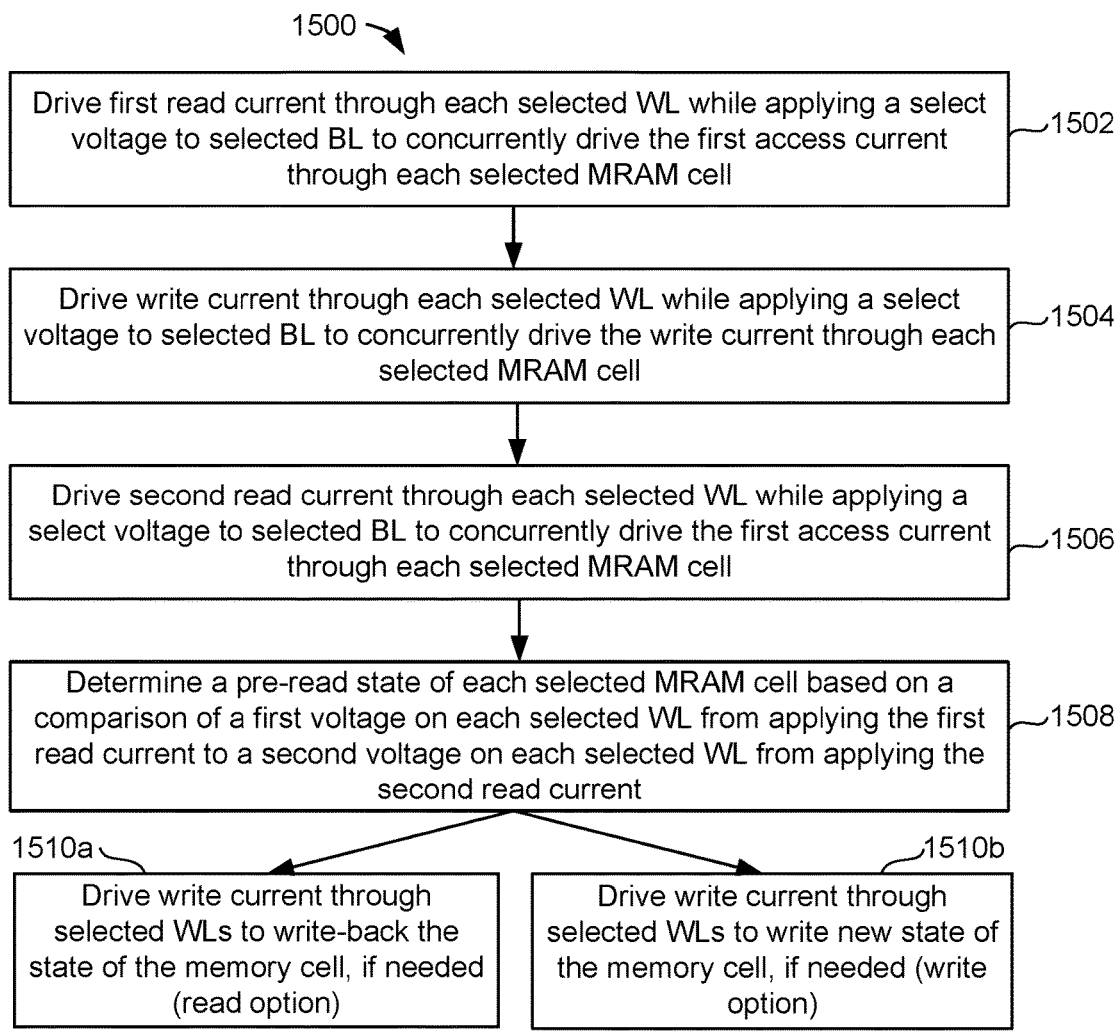
FIG. 15 is a flowchart depicting one embodiment of a process of concurrently accessing multiple memory cells in a cross-point array that includes performing an SSR.

FIGS. 8A and 8B illustrate an embodiments for the structure of an MRAM memory cell. In FIG. 8A, a voltage being applied across the memory cell, between the memory cell's corresponding word line and bit line, is represented as a voltage source $V_{app}$ 813. The memory cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

In the embodiment of FIG. 8B, a forced current approach is used to access the MRAM cell. The forced current approach may be used to read or write the MRAM cell. In the forced current approach, an access current (e.g., $I_{read}$ $I_{write}$) is driven through the bottom electrode 801 by a current source 823. The current source 823 is a part of the driver circuitry for the bottom electrode 801. A voltage (e.g., $V_{select}$) is provided to the top electrode 811. Herein, the terms "read current" ($I_{read}$) and "write current" ($I_{write}$) will be used in connection with access currents that are driven through MRAM cells. A write current is a current that is driven through a first conductive line (e.g., word line) that, in combination with a voltage applied to a second conductive line (e.g., bit line), will change the state of the MRAM cell. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will not change the state of an MRAM cell from the P-state to the AP-state or from the AP-state to the P-state if applied for limited time, such as less than 30 ns.

As defined herein, the access current may have a positive magnitude or a negative magnitude. A positive magnitude access current that is driven through a first conductive line (e.g., word line) at a given point will flow in the opposite direction as a negative magnitude access current that is driven through the first conductive line at the given point. Hence, the access current may flow through the MRAM cell in either direction, depending on the whether the access current is defined as having has a positive or negative magnitude. In one embodiment, the MRAM cell is read by applying, for example, 0V to the top electrode 811, while driving a current of, for example, 15 micro Amperes (µA) through the bottom electrode 801. This read current will flow from the bottom electrode 801 to the top electrode 811. In one embodiment, the MRAM cell is written from the AP-state to the P-state by applying, for example, 3V to the top electrode 811, while driving a write current of, for example, −30 µA through the bottom electrode 801. This write current will flow from the top electrode 811 to the bottom electrode 801. In one embodiment, the MRAM cell is written from the P-state to the AP-state by applying, for example, 0V to the top electrode 811, while driving a current of, for example, 30 µA through the bottom electrode 801. This write current will flow from the bottom electrode 801 to the top electrode 811.

Figure 9:
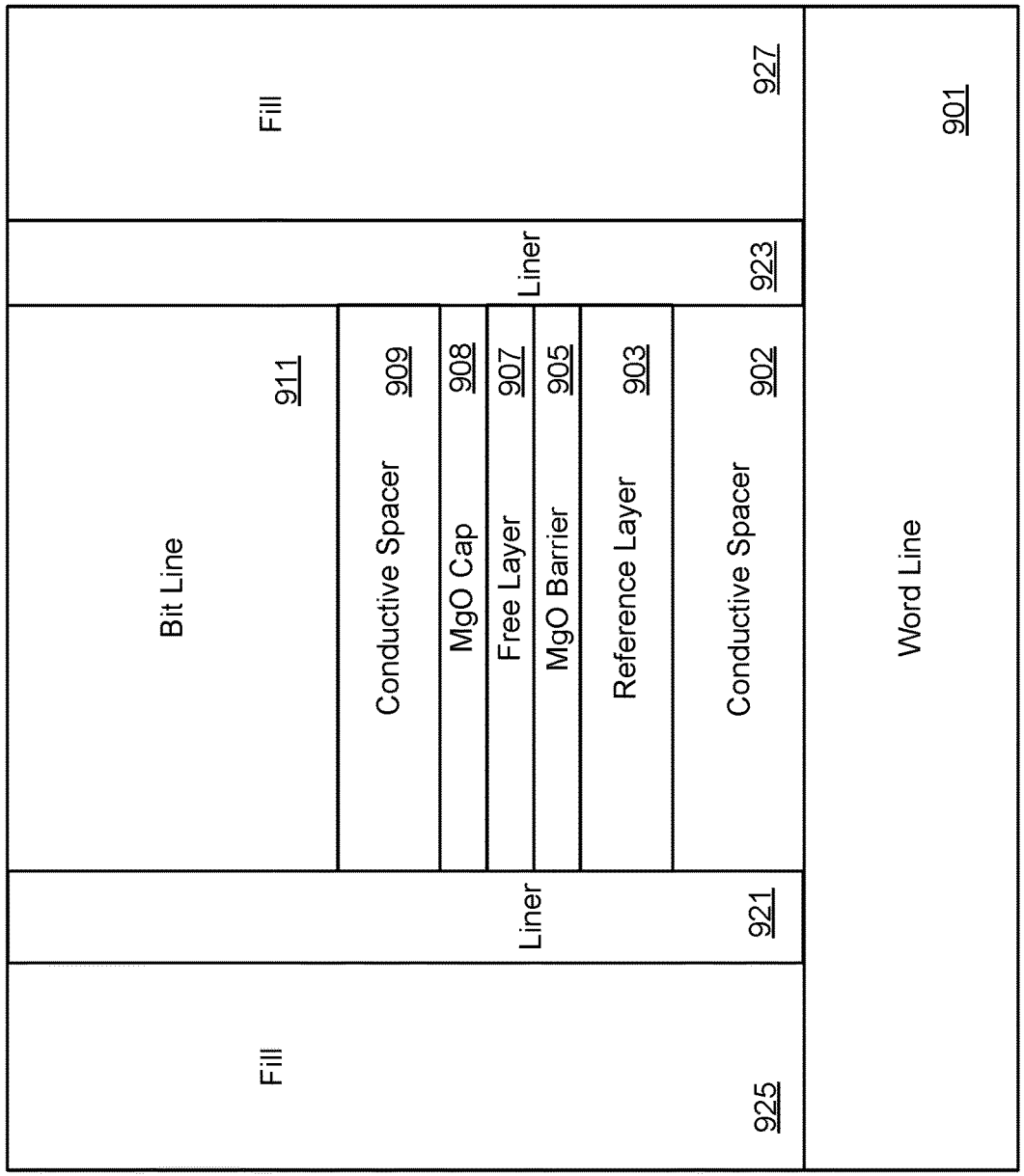
FIG. 9 illustrates an embodiment for an MRAM memory cell design as it would be implemented in a cross-point array in more detail.

FIG. 9 illustrates an embodiment for an MRAM memory cell design as it would be implemented in a cross-point array in more detail. When placed in a cross-point array, the top and bottom electrodes of the MRAM memory cells will be two of the adjacent layers of wires of the array, for example the top and bottom wires of the two level or two deck array. In the embodiment shown here, the bottom electrode is the word line (WL) 901 and the top electron is the bit line (BL) 911 of the memory cell, but these can be reversed in some embodiments by reversing the orientation of the memory element. Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multilayer coupled with an Ir or Ru spacer 902. The MgO cap 908 is optional, but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM memory cells have a directionality and, because of this, in some circumstances there is a preference for reading in one direction over the other. For example, the optimum current amplitude to write a bit into the AP (high resistance state, HRS) may be greater than that to write to the P (low resistance state) by about 20%, so bit error rate (read disturb) is less probable if reading to AP (2AP). Some of these circumstances and the resultant directionality of a read are discussed below. The directionality of the biasing particularly enters into some embodiments for the programming of MRAM memory cells, as is discussed further with respect to FIGS. 10A and 10B.

Figure 10A:
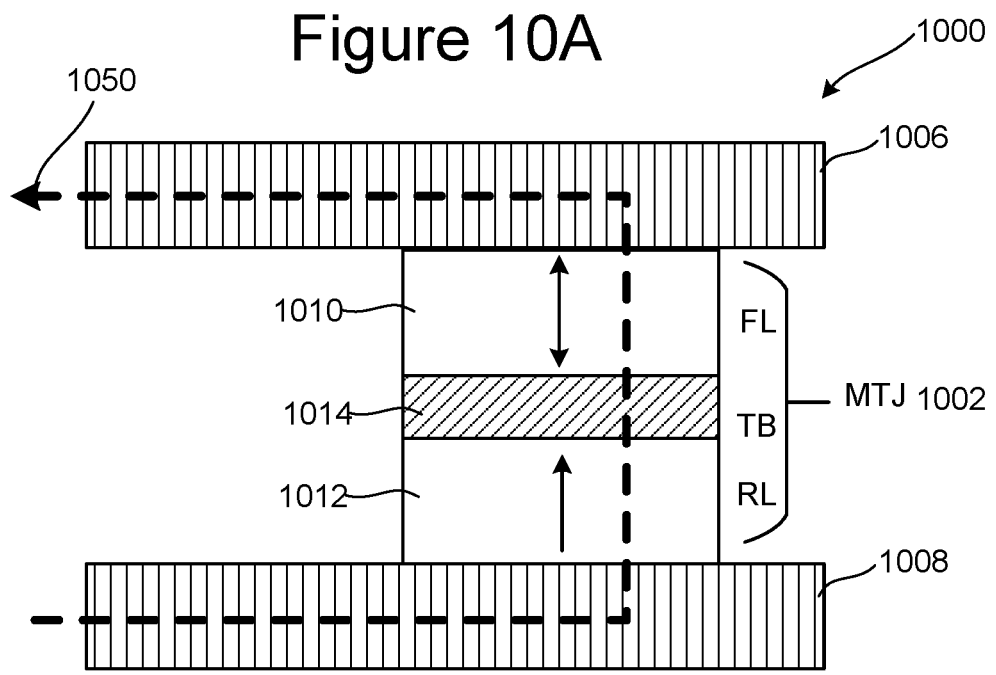
FIGS. 10A and 10B illustrate the writing of an MRAM memory cell by use of a spin torque transfer (STT) mechanism.
Figure 10B:
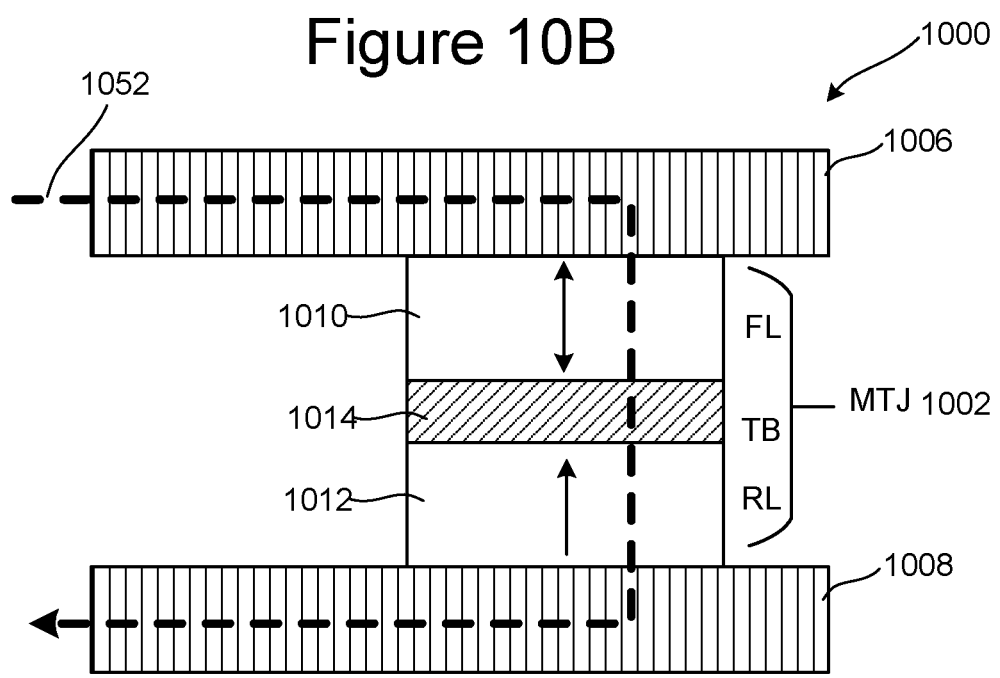

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the used of spin transfer torque to program or write to MRAM memory. Spin transfer torque magnetic random access memory (STT MRAM) has the advantages of lower power consumption and better scalability over other MRAM variations. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms electron behavior, FIGS. 10A and 10B and their discussion are given in terms of electron current, where the direction of the write current is defined as the direction of the electron flow. Therefore, the term "write current" in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by use a the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By process and circuit design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is placed at a higher voltage level than bottom conductor 1008, due the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can read by measuring the resistance of the memory cell 1000. Low resistance typically represents a "0" bit and high resistance typically represents a "1" bit, although sometimes the alternate convention occurs. A read current can being applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments, such as when the write current required is higher; e.g. P2AP so reading in this direction may result in reduced BER (read disturbs).

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected memory cell (bit) is biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM) memory cell. For example, a select transistor can be placed in series with each resistive memory cell element in FIGS. 7A-7D so that the elements 701 is now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

Figure 14:
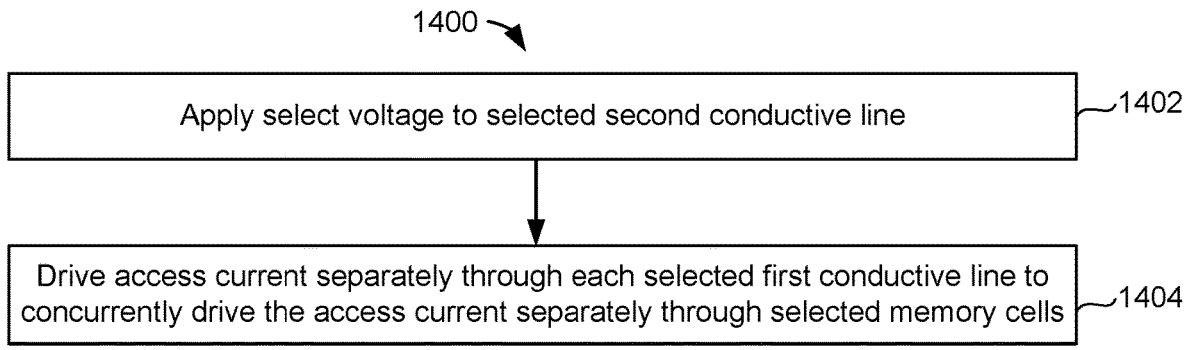
FIG. 14 is a flowchart of one embodiment of a process of concurrently accessing multiple memory cells in a cross-point array.

An alternate approach to selector elements is the use of a threshold switching selector element in series with the programmable resistive element to comprise an individual memory cell or bit. A threshold switching selector has a high resistance (in an off or non-conductive state) when it is biased to a voltage lower than its threshold voltage ($V_{th}$) and current lower than its threshold current ($I_{th}$), and a low resistance (in an on or conductive state) when it is biased to a current higher than its threshold current and holding current. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell with the resulting state determined by the direction of current if magnitude is sufficient to write, for example if the current is greater than 35 µa for 20 nm critical dimension (CD) MRAM with a resistance-area (RA) 10 $\Omega$-µm²; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS). Examples, as shown in FIG. 14 presented below, include Ge—Se, Ge—Se—N, Ge—Se—As, Ge—Se—Sb—N, Ge58Se42, GeTe6, Si—Te, Zn—Te, C—Te, B—Te, Ge—As—Te—Si—N, Ge—As—Se—Te—Si and Ge—Se—As—Te.

Figure 11A:
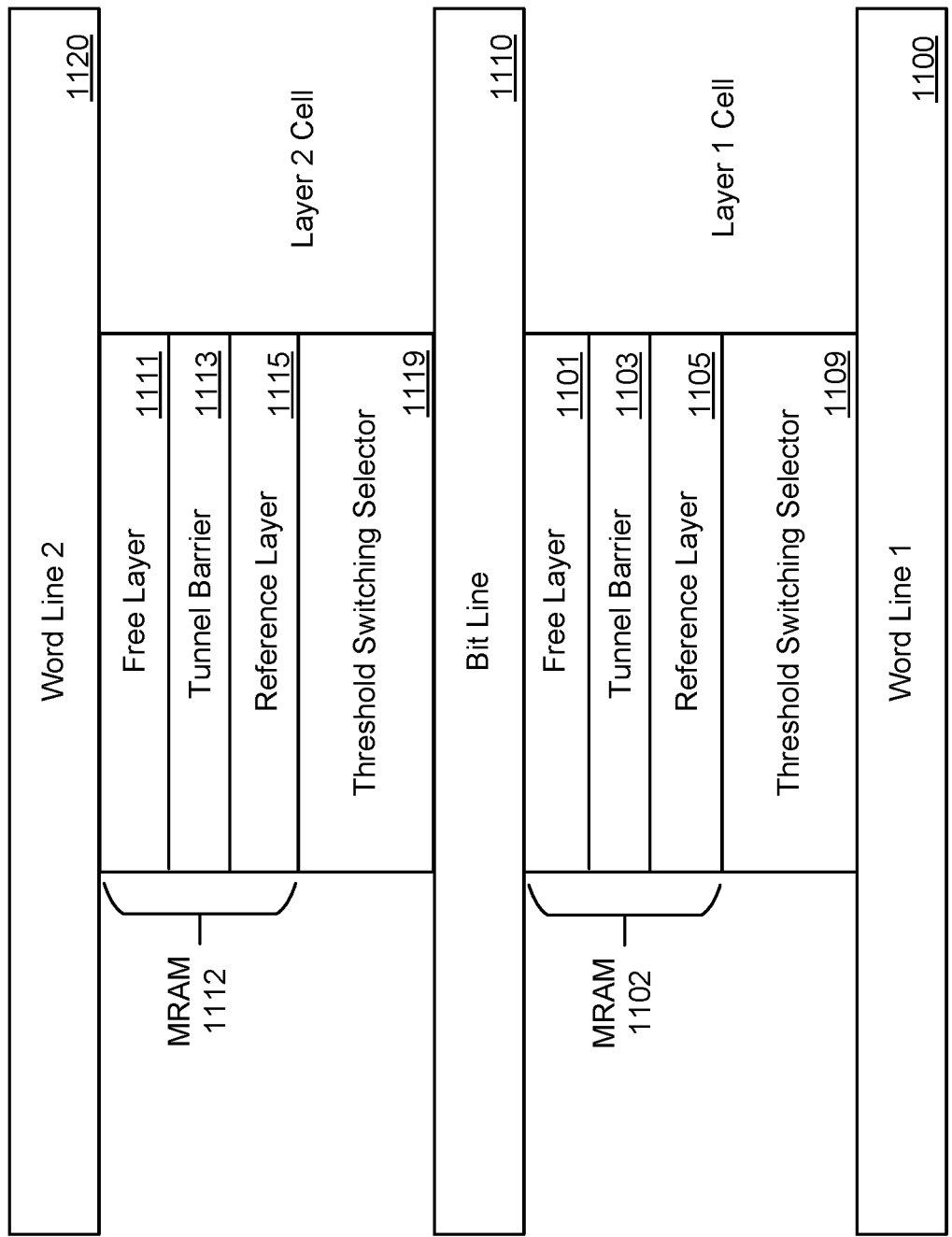
FIGS. 11A and 11B illustrate embodiments for the incorporation of threshold switching selectors into an MRAM memory array having a cross-point architecture.
Figure 11B:
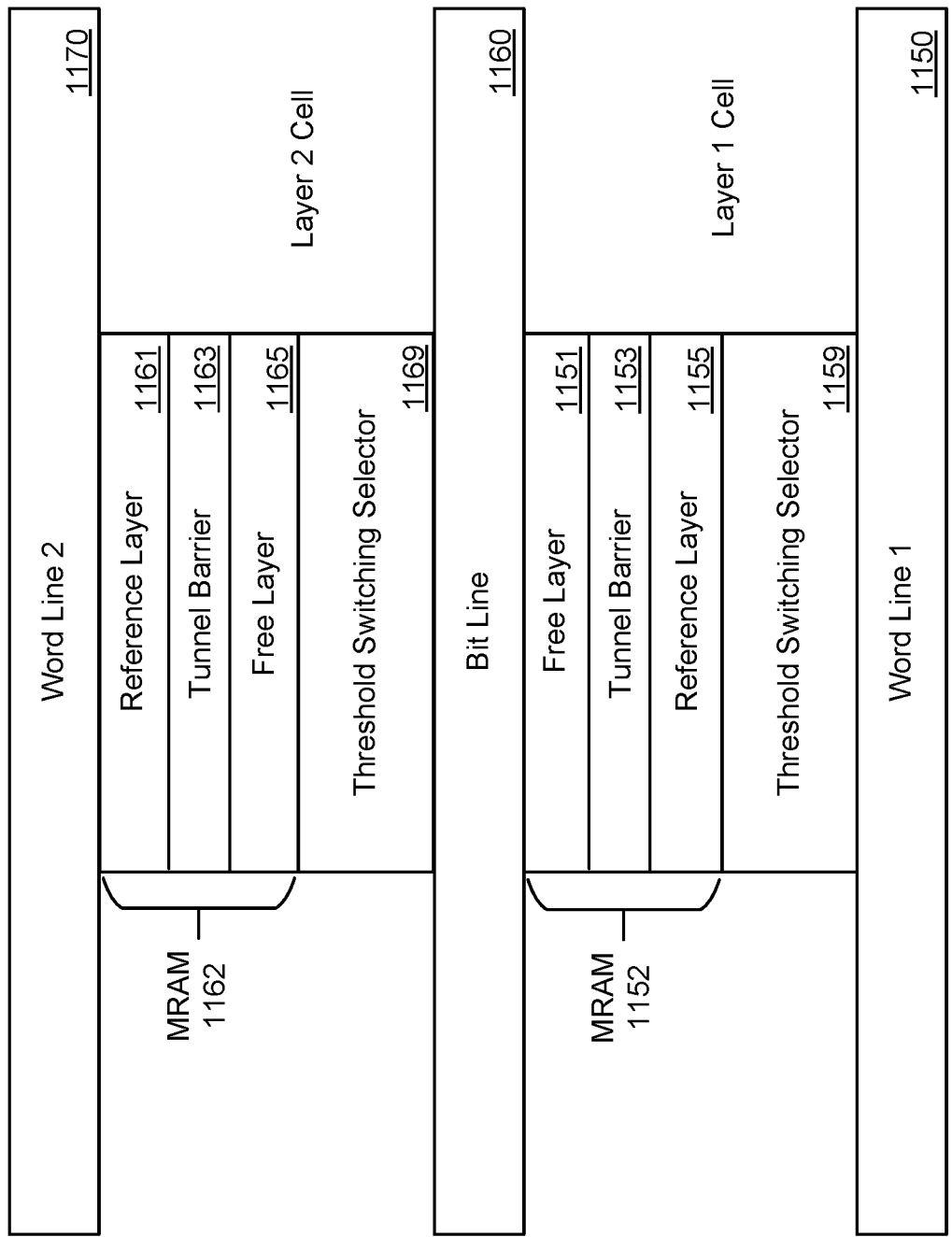

FIGS. 11A and 11B illustrate embodiments for the incorporation of threshold switching selectors into an MRAM memory array having a cross-point architecture. The examples of FIGS. 11A and 11B show two MRAM cells in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, by in a cross-point array they would be more accurately represented as represented in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM cell 1102 including free layer 1101, tunnel barrier 1103, and reference layer 1105 is formed above the threshold switching selector 1109, where this series combination of the MRAM device 1102 and the threshold switching selector 1109 together form the layer 1 cell between the bit line 1110 and word line 1 1100. The series combination of the MRAM device 1102 and the threshold switching selector 1109 operate as largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage or current above the threshold of the threshold switching selector 1109, and then the biasing current or voltage needs to be maintained high enough above the holding current or holding voltage of the threshold switching selector 1109 so that it stays on during the subsequent read or write operation.

On the second layer, an MRAM cell 1112 includes free layer 1111, tunnel barrier 1113, and reference layer 1115 is formed above the threshold switching selector 1119, with the series combination of the MRAM device 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120.

In the embodiment of FIG. 11A, the threshold switching selector 1109/1119 is formed below the MRAM device 1102/1112, but in alternate embodiments the threshold switching selector can be formed above the MRAM device for one or both layers. As discussed with respect to FIGS. 10A and 10B, the MRAM memory cell is directional. In FIG. 11A, the MRAM devices 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM structure 1152 having a free layer 1151 formed over tunnel barrier 1153, that is turn formed over the reference layer 1155, with the MRAM structure 1152 formed over the threshold switching selector 1159. The second layer of the embodiment of FIG. 11B again has an MRAM device 1162 formed over a threshold switching selector 1169 between the bit line 1160 and word line 2 1170, but, relative to FIG. 11A, with the MRAM device 1162 inverted, having the reference layer 1161 now formed above the tunnel barrier 1163 and the free layer 1165 now under the tunnel barrier 1163.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level.

To either read data from or write of data to an MRAM memory cell involve passing a current through the memory cell. In embodiments where a threshold switching selector is placed in series with the MRAM element, before the current can pass through the MRAM element the threshold switching selector needs to be turned on by applying a sufficient voltage across the series combination of the threshold switching selector and the MRAM element.

It can be quite difficult to concurrently access more than one bit in a cross-point memory array. Techniques are disclosed herein for concurrently accessing multiple memory cells in a cross-point array. In one embodiment, multiple memory cells in a cross-point array are read concurrently. In one embodiment, multiple memory cells in a cross-point array are written concurrently.

Figure 12:
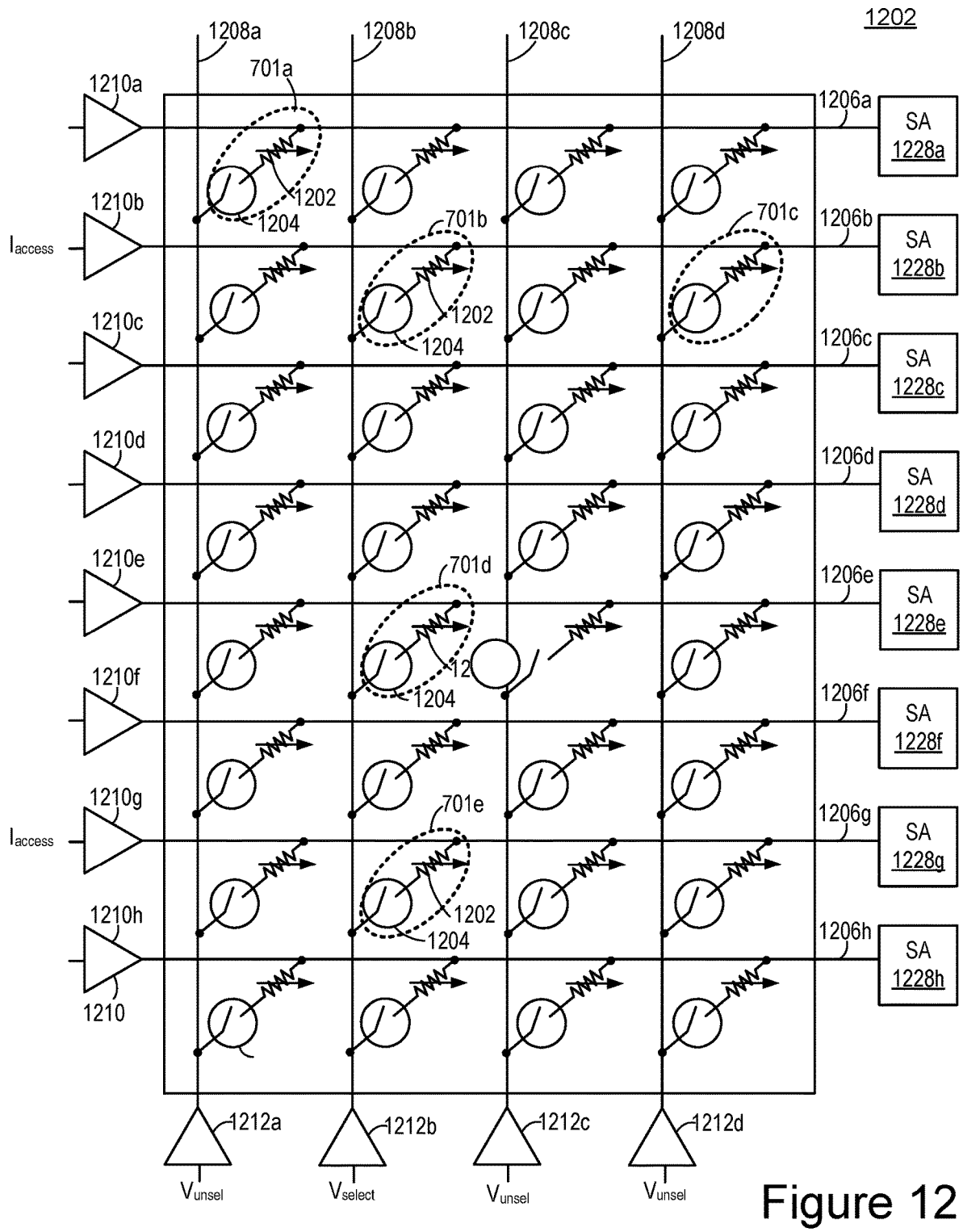
FIG. 12 depicts an embodiment of a memory array having a cross-point architecture, in which multiple memory cells are concurrently accessed.

FIG. 12 depicts an embodiment of a memory array 1202 having a cross-point architecture, in which multiple memory cells are concurrently accessed. The array 1202 has a set of first conductive lines 1206a-1206h and a set of second conductive lines 1208a-1208d. In one embodiment, the set of first conductive lines 1206a-1206h are word lines and the set of second conductive lines 1208a-1208b are bit lines. For ease of discussion, the set of first conductive lines 1206a-1206h may be referred to as word lines and the set of second conductive lines 1208a-1208b may be referred to as bit lines. However, the set of first conductive lines 1206a-1206h could be bit lines and the set of second conductive lines 1208a-1208b could be word lines.

The array 1202 has a number of memory cells 701. Each memory cell 701 is connected between one of the first conductive lines 1206 and a corresponding one of the second conductive lines 1208. Each memory cell 701 has a magnetoresistive random access memory (MRAM) element 1202 in series with a threshold switching selector 1204. Hence, each memory cell 701 may be referred to as an MRAM cell. The threshold switching selector 1204 is configured to become conductive in response to application of a voltage or current level exceeding threshold of the threshold switching selector 1204.

Each first conductive line 1206 is driven by one of the current drivers 1210a-1210h. For example, first conductive line 1206a is driven by current driver 1210a, first conductive line 1206b is driven by current driver 1210b, etc. Each second conductive line 1208 is driven by one of the voltage drivers 1212a-1212d. For example, second conductive line 1208a is driven by voltage driver 1212a, second conductive line 1208b is driven by voltage driver 1212b, etc. Current driver 1210b drives an access current ($I_{access}$) through selected word line 1206b. Likewise, current driver 1210g drives $I_{access}$ through selected word line 1206b. The current drivers 1210 are configured to either source a current or sink a current. Thus, $I_{access}$ could flow in either direction through the selected word line. Whether a current driver 1210 sources or sinks a current, herein this will be referred to as driving the current through the word line. In one embodiment, a relatively low current is driven through unselected word lines (e.g., 1206a, 1206c, 1206d, 1206e, 1206f, and 1206h). Note that herein, a "selected word line" means that the word line is connected to a selected memory cell. An "unselected word line" means that the word line is not connected to any selected memory cells. In other words, all memory cells that connect to an unselected word line are unselected memory cells. Note that herein, a "selected bit line" means that the bit line is connected to at least one selected memory cell. An "unselected bit line" means that the bit line is not connected to any selected memory cells. In other words, all memory cells that connect to an unselected bit line or unselected word line are unselected memory cells.

Two of the memory cells 701b, 701e are selected for concurrent access. Selected memory cell 701b is at the cross-point of selected word line 1206b and selected bit line 1208b. The other memory cells not selected for access (i.e., are unselected memory cells). For example, memory cells 701a, 701c, 701d, as well as memory cells not specifically labelled with a reference number, are not selected for access. Selected memory cell 701e is at the cross-point of selected word line 1206g and selected bit line 1208. All other word lines and all other bit lines are unselected. To select a memory cell 701, a select voltage ($V_{select}$) is provided to the selected bit line (e.g., bit line 1208b) and an access current is driven through a selected word line (e.g., word lines 1206b, 1206g). An unselect voltage ($V_{unsel}$) is provided to the unselected bit lines (e.g., bit lines 1208a, 1208c, 1208d). In one embodiment, $V_{select}$ has a magnitude such that the threshold switching selector 1204 in a selected memory cell will turn on. On the other hand, $V_{unsel}$ has a magnitude such that the threshold switching selector 1204 in an unselected memory cell will not turn on.

One of the sense amplifiers (SA) 1228a-1228h is connected to each word line. For example, SA 1228a is connected to word line 1206a, SA 1228b is connected to word line 1206b, etc. Each sense amplifier is configured to sense a voltage on the word line 1206 to which the SA is connected.

In the example of FIG. 12, there are more word lines than bit lines in the cross-point array. In one embodiment, there are more bit lines than word lines in the cross-point array. In one embodiment, the number of bit lines equals the number of word lines in the cross-point array. In the example of FIG. 12, there are twice as many word lines as bit lines in the cross-point array; however, a different ratio could be used.

Figure 13:
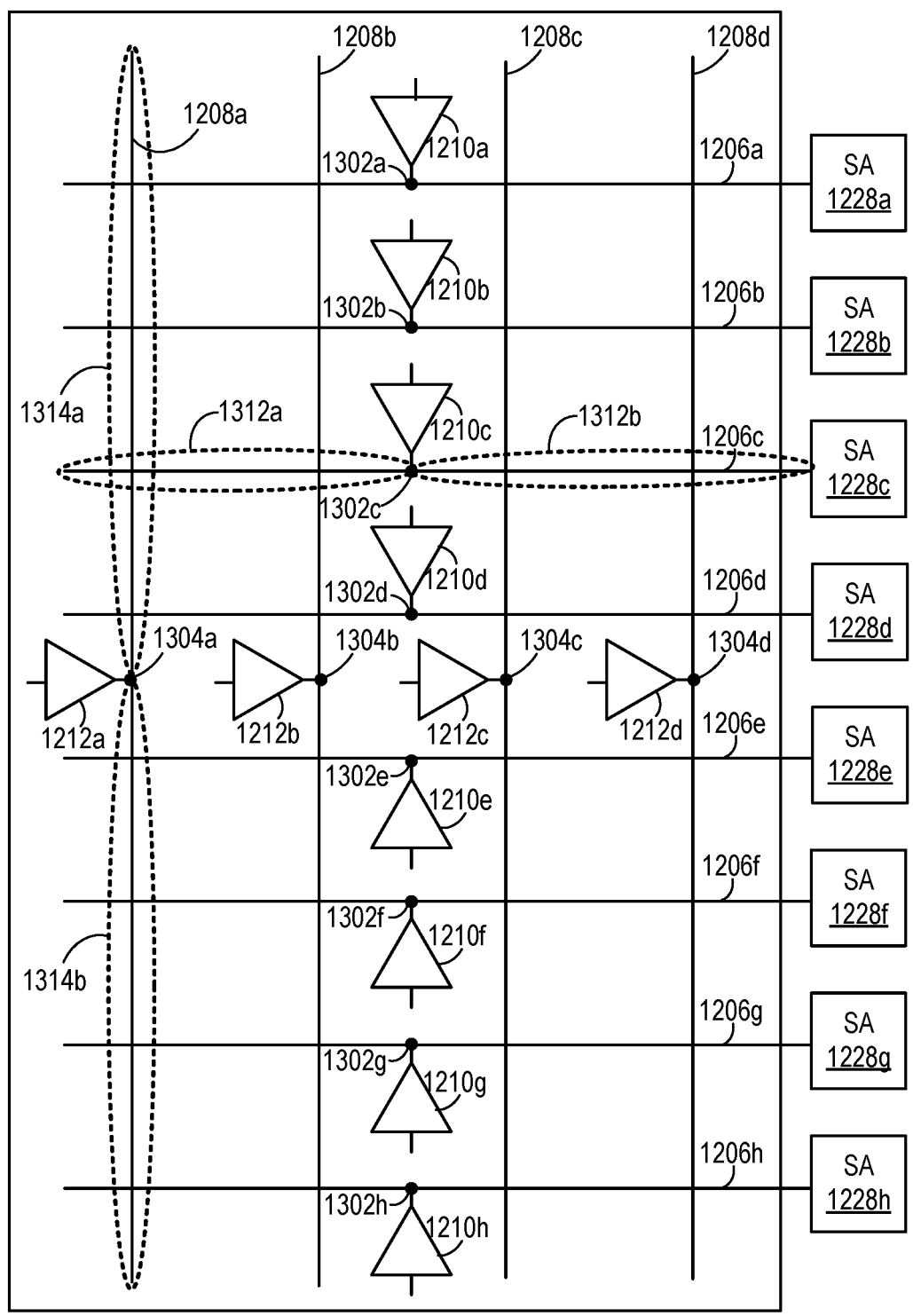
FIG. 13 depicts an embodiment of a memory array having a cross-point architecture, showing locations of contacts from drivers to bit lines and word lines.

In some embodiments, the voltage drivers 1212 connect to the respective bit lines 1208 at strategic locations. In some embodiments, the current drivers 1210 connect to the respective word lines 1206 at strategic locations. FIG. 13 depicts an embodiment of a memory array 1202 having a cross-point architecture, showing locations of contacts from drivers to bit lines and word lines. The memory array 1202 in FIG. 13, which can correspond to array 502/602 of FIG. 5 or 6A, depicts the same word lines 1206a-1206h and bit lines 1208a-1208d, as the array in FIG. 12. However, the memory cells 701 are not depicted in FIG. 13.

Each current driver 1210a-1210h is connected to one of the word lines 1206 by a corresponding one of the word line contacts 1302a-1302h. In one embodiment, a current driver connects to its corresponding word line by way of a via. Thus, the current driver could reside at a different level of the cross-point array than the word line it drives. The current drivers 1210 could be located outside of the cross-point array, such as on control die 611. Each word line contact 1302 connects to a word line 1206 at a location that divides the respective word line 1206 into a first portion and a second portion. For example, word line contact 1302c connects to word line 1206c at a location that divides word line 1206c into a first portion 1312a and a second portion 1312b. In some embodiments, half of the bit lines 1208 are located such that they cross the word lines 1206 somewhere in the respective first portions and the other half of the bit lines are located such that they cross the word lines somewhere in the respective second portions. For example, bit lines 1208a and 1208b cross the first portion 1312a of word line 1206c, whereas bit lines 1208c and 1208d cross the second portion 1312b of word line 1206c. In some embodiments, the word line contacts 1302 at located at a midpoint of the respective word lines 1206. Thus, in some embodiments, the first and second portions of the respective word lines are about the same length.

Each voltage driver 1212a-1212d is connected to one of the bit lines 1208 by a corresponding one of the bit line contacts 1304a-1304d. In one embodiment, a voltage driver connects to its corresponding bit line by way of a via. Thus, the voltage driver could reside at a different level of the cross-point array than the bit line it drives. The voltage drivers 1212 could be located outside of the cross-point array, such as on control die 611. Each bit line contact 1304 connects to a bit line 1208 at a location that divides the respective bit line 1208 into a first portion and a second portion. For example, bit line contact 1304a connects to bit line 1208a at a location that divides bit line 1208a into a first portion 1314a and a second portion 1314b. In some embodiments, half of the word lines 1206 are located such that they cross the bit lines somewhere in the respective first portions and the other half of the word lines 1206 are located such that they cross the bit lines somewhere in the respective second portions. For example, word lines 1206a-1206d cross the first portion 1314a of bit line 1208a whereas word lines 1206e-1206h cross the second portion 1314b of bit line 1208a. In some embodiments, the bit line contacts 1304 at located at a midpoint of the respective bit lines 1208. Thus, in some embodiments, the first and second portions of the respective bit lines 1208 are about the same length.

FIG. 14 is a flowchart of one embodiment of a process 1400 of concurrently accessing multiple memory cells in a cross-point array. In an embodiment, the memory cells are MRAM cells. In one embodiment, the process 1400 is performed to concurrently read one or multiple memory cells in a cross-point array. In one embodiment, the process 1400 is performed to concurrently write multiple memory cells in a cross-point array. In one embodiment, the process 1400 is performed by a control circuit in the memory die 500. In one embodiment, the process 1400 is performed by a control circuit in the control die 611. Reference will be made to the cross-point array depicted on FIG. 13 to discuss process 1400; however, process 1400 is not limited to the array depicted in FIG. 13.

Step 1402 includes applying a select voltage to a selected second conductive line 1208. With reference to FIG. 13, $V_{select}$ is applied by voltage driver 1212b to second conductive line 1208b. Step 1402 may also include applying an unselect voltage to unselected second conductive lines 1208. With reference to FIG. 13, $V_{unsel}$ is applied by voltage driver 1212a to second conductive line 1208a, by voltage driver 1212c to second conductive line 1208c, and by voltage driver 1212d to second conductive line 1208d. In some embodiments, the second conductive lines are bit lines.

Step 1404 includes driving an access current separately through each selected first conductive line 1206 to concurrently drive the access current separately through each selected memory cell. Note that the access current could flow in either direction through the first conductive line 1206, depending on whether the access current is defined as having a positive or a negative magnitude. The access current is driven through the memory cells while the select voltage is applied to the selected second conductive line. With reference to FIG. 13, $I_{access}$ is driven by current driver 1210b through selected first conductive line 1206b to drive $I_{access}$ through memory cell 701b. At about the same time, $I_{access}$ is driven by current driver 1210g through selected first conductive line 1206g to drive $I_{access}$ through memory cell 701e. Thus, $I_{access}$ is currently driven separately through multiple selected memory cells in the cross-point array.

In one embodiment, the access current in step 1404 is used to concurrently read the memory cells, a current sufficient to exceed $I_{hold}$, for example 15 μa if MRAM has a 20 nm CD with an RA of 10 Ω-μm². Hence, the access current may be referred to as a read current. In this case, process 1500 may further include sensing a voltage on each respective selected first conductive line 1206 in order to concurrently read each memory cell.

In one embodiment, the access current in step 1404 is used to concurrently write the memory cells. Hence, the access current may be referred to as a write current. In one embodiment, the access current will change an MRAM cell from the P-state to the AP-state. Hence, multiple MRAM cells in the cross-point array may be concurrently programmed from the P-state to the AP-state. In one embodiment, the access current will change an MRAM cell from the AP-state to the P-state. Hence, multiple MRAM cells in the cross-point array may be concurrently programmed from the AP-state to the P-state. In some embodiments, the write operation is a two stage operation. In one embodiment, of an MRAM two stage write operation, a first stage places all selected memory cell into the AP-state. The second stage writes the appropriate or selected MRAM cells from the AP-state to the P-state. Alternatively, the first stage could program to the P-state, and the second stage to the AP-state. In another embodiment, the cell is first read P2AP direction with a read current such as 15 μa, and generates a resulting voltage on the global decoded node into the sense amp (above the bit line drive to approximately 0V, bit line decoder, bit line, memory cell, word line, word line decoder, where the global node is driven by a read current sufficient to turn on and maintain the bit selector in a conducting state. The resulting voltage may be temporarily stored on a capacitor and adjusted up by coupling into the storing capacitor charge from another capacitor that has its other terminal switch from low to a high voltage, for example, moving the stored voltage by 150 mV. Next the current P2AP is increased to a write current such as 35 ua for approximately 50 ns, for example. Next the read is again performance but the resulting voltage is compared by a comparator to the earlier stored and adjusted voltage. If the voltage has changed enough (more than 150 mv for example), the bit was in the LRS state. If the change was less than 150 mv, the bit was in the HRS. Next the bit can be written back to the LRS state by reversing the direction of the write current, or it can be left in the HRS state.

A number of different strategies may be used to select which memory cells in the cross-point array are concurrently accessed. With reference again to FIG. 13, in some embodiments, the selected memory cells are selected with respect to their locations relative to the bit line contact 1304. In one embodiment of concurrent access, there is one selected bit line and one or more pairs of selected word lines. For purpose of illustration, some examples in which there is one selected bit line and one pair of selected word lines will be discussed. In one embodiment, the pair of selected word lines are chosen based on the distance from the bit line contact 1304 of the selected bit line to the point at which the selected word line crosses the selected bit line. In one embodiment, the distance from the bit line contact 1304 of the selected bit line to the aforementioned crossing point is about the same for both members of the pair of selected word lines. Stated another way, the two members of the pair of selected word lines are equidistant from the connection point of the bit line contact to the respective points at which each member crosses the selected bit line. Herein, "equidistant" means "about the same distance." In one embodiment, the difference of distances is less than five percent. For example, with reference to FIG. 14, the pair could include word lines 1206b and 1206g. Alternatively, the pair could include word lines 1206*d* and 1206*e*. This strategy results in about the same IR drop between where the bit line contact 1304 connects to the selected bit line and where the selected bit line will connect to each respective selected memory cell. This strategy helps to improve read margin, thereby providing for accurate sensing of each selected memory cell.

A similar strategy to the aforementioned distance based example is based on the number of word lines between the selected word line and where the bit line contact 1304 connects to the selected bit line. In one embodiment, each member of the pair of word lines is "n" word lines away from the connection point at which the bit line contact 1304 connects to the selected bit line. For example, word lines 1206*b* and 1206*g* are each three word lines away from where the bit line contacts 1304 connect to the bit lines 1208 (this example counts the word lines 1206*b* and 1206*g* as one of the three word lines). Note that in some embodiments the word lines may be symmetrically spaced with respect to the location of the bit line contacts such that this strategy also leads to about the same IR drop between where the bit line contact 1304 connects to the selected bit line and where the selected bit line will connect to each respective selected memory cell. Hence, this strategy helps to improve read margin, thereby providing for accurate sensing of each selected memory cell.

In another distance based embodiment, the locations of the selected word lines are chosen in order to keep about the same total distance between where the bit line contact 1304 connects to the selected bit line and where the respective selected word lines cross the selected bit line. This will be explained by way of an example. With reference to FIG. 13, the word line pairs may be word lines 1206*a* and 1206*e*; word lines 1206*b* and 1206*f*; word lines 1206*c* and 1206*f*; and word lines 1206*d* and 1206*h*. This strategy can be beneficial for error correction. In some cases, the location of the selected memory cell (and hence the location of the selected word line) impacts the reliability of the data stored in the memory cell. As one example, it may be that data stored in memory cells along word line 1206*a* is less reliable than data stored in memory cells along word line 1206*d*. Likewise, it may be that data stored in memory cells along word line 1206*h* is less reliable than data stored in memory cells along word line 1206*e*. This strategy thus reads lower reliability data concurrently with higher reliability data. In some embodiments, both of these bits of data are part of the same ECC codeword. If, instead, a memory cell along word line 1206*a* and a memory cell along word line 1206*b* were read concurrently, then two lower reliability bits would be read together, which increases the chances that decoding the codeword would fail. However, by mixing lower reliability bits with higher reliability bits, decoding the codeword is less likely to fail. Hence, this strategy improves decoding of codewords stored in the memory cells.

A similar strategy to the aforementioned total distance based example is based on the total number of word lines between the respective members of a pair of selected word lines and where the bit line contact 1304 connects to the selected bit line. In one embodiment, the total number of word lines is the same for each pair of selected word lines. With reference to FIG. 13, if the word line pairs are word lines 1206*a* and 1206*e*, word lines 1206*b* and 1206*f*, word lines 1206*c* and 1206*f*, and word lines 1206*d* and 1206*h*, then in each case there are a total of three word lines between the respective members of the pair of selected word lines and where the bit line contact 1304 connects to the selected bit line (this example does not count the selected word lines as one of the word lines that are "between" the respective members of a pair of selected word lines and where the bit line contact 1304 connects to the selected bit line).

In some embodiments, concurrent access of multiple memory cells in a cross-point array includes performing a self-referenced read (SRR). In one embodiment, a SRR read is used during a concurrent read of multiple memory cells in a cross-point array. In one embodiment, a SRR read is used during a concurrent write of multiple memory cells in a cross-point array. In one embodiment, the SRR read is used to concurrently place multiple MRAM cells into an AP-state.

FIG. 15 is a flowchart depicting one embodiment of a process 1500 of concurrently accessing multiple memory cells in a cross-point array that includes performing an SSR. The SRR may be referred to as a destructive SRR, which means that the original state of the memory cell may be changed during the SRR. In one embodiment, the process 1500 is performed to concurrently read multiple memory cells in a cross-point array. In one embodiment, the process 1500 is performed during a concurrent write of multiple memory cells in a cross-point array. In one embodiment, the process 1500 is performed by a control circuit in the memory die 500. In one embodiment, the process 1500 is performed by a control circuit in the control die 611.

Figure 16A:
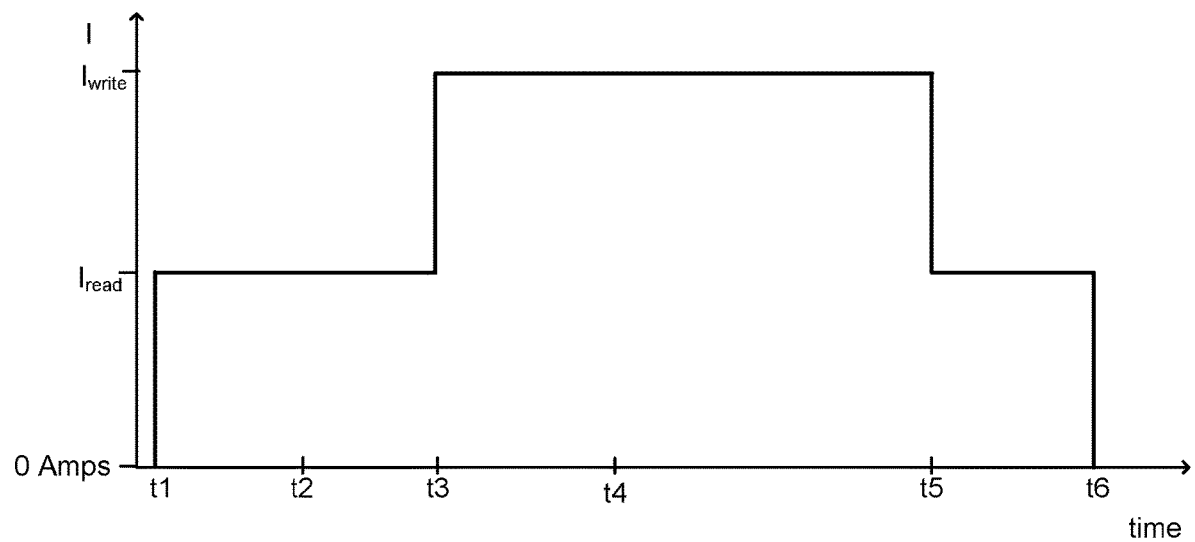
FIG. 16A depicts current versus time for the access current that is driven through the selected word lines during a SRR.
Figure 16B:
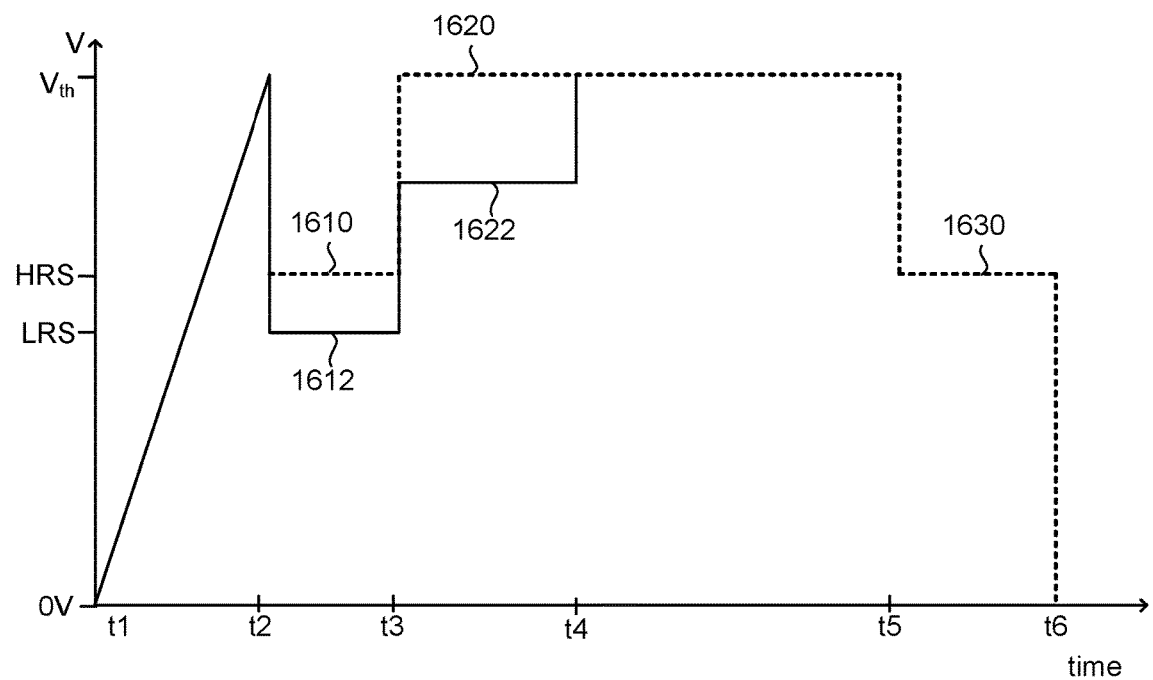
FIG. 16B depicts voltage versus time for the voltage across a selected MRAM cell during the SRR, and corresponds to FIG. 16A.

Reference will be made to the cross-point array depicted on FIG. 13 to discuss process 1500; however, process 1500 is not limited to the array depicted in FIG. 13. In process 1500, the memory cells are described as MRAM cells. However, the process 1500 may be used with other types of memory cells in cross-point arrays. Process 1500 will be discussed with reference to FIGS. 16A and 16B. FIG. 16A depicts current versus time for the access current that is driven through the selected word lines. FIG. 16B depicts voltage versus time for the voltage across a selected MRAM cell.

Step 1502 includes driving a first read current through each selected word line while applying a select voltage to a selected bit line in order to drive the first access current through each selected MRAM cell. With reference to FIG. 13, $I_{access}$ is driven by current driver 1210*b* through selected first conductive line 1206*b* to drive $I_{access}$ through memory cell 701*b*. At about the same time, $I_{access}$ is driven by current driver 1210*g* through selected first conductive line 1206*g* to drive $I_{access}$ through memory cell 701*e*. With reference to FIG. 13, $V_{select}$ is applied by voltage driver 1212*b* to second conductive line 1208*b*. In one embodiment, $I_{access}$ is 15 µA and $V_{select}$ is 0V.

FIGS. 16A and 16B will now be discussed with respect to one MRAM cell 701 to further elaborate on step 1502. With reference to FIG. 16A, the access current is increased to $I_{read}$ at time t1 and is held at $I_{read}$ until t3. With reference to FIG. 16B, the voltage across the memory cell 701 increases from t1 to t2. The threshold switching selector 1204 is off between t1 and t2. Between t1 and t2, the access current causes the word line voltage to increase. The access current also supports any leakage in the path. Once the voltage across threshold switching selector 1204 reaches the threshold voltage $V_{th}$ of the threshold switching selector 1204, it will turn on and switch to a low resistance state (at t2). Thus, the voltage across the series combination of the threshold switching selector 1204 and the resistive MRAM element 1202 ramps up as the threshold switching selector is in an off state.

Once the threshold switching selector 1204 is in the on state (at t2), the $I_{read}$ current will flow through the selected memory cell 701. As the access current is held fixed at $I_{read}$, the voltage across the memory cell will drop to a level dependent upon the series resistance of the MRAM element 1202 and the on-state resistance of the threshold switching selector 1204. For a binary embodiment, the memory cell will have a high resistance, AP-state, and a low resistance, P-state. The resultant voltage across the series connected MRAM element 1202 and threshold switching selector 1204 in response to the $I_{read}$ current for the high resistance state (HRS) and low resistance state (LRS) are respectively shown as lines 1610 and 1612. Although the discussion here is in the context of an MRAM based memory cell being placed in series with the threshold switching selector, this read technique can similarly be applied to other programmable resistance memory cells, such as PCM or ReRAM devices.

Returning again to FIG. 15, step 1504 includes driving a write current through each selected word line while applying a select voltage to the selected bit line to concurrently drive the write current through each selected MRAM cell. With reference to FIG. 13, $I_{access}$ is driven by current driver 1210b through selected first conductive line 1206b to drive $I_{access}$ through memory cell 701b. At about the same time, $I_{access}$ is driven by current driver 1210g through selected first conductive line 1206g to drive $I_{access}$ through memory cell 701e. With reference to FIG. 13, $V_{select}$ is applied by voltage driver 1212b to second conductive line 1208b. In one embodiment, $I_{access}$ is 30 μA and $V_{select}$ is 0V.

FIGS. 16A and 16B will now be discussed with respect to one MRAM cell 701 to further elaborate on step 1504. With reference to FIG. 16A, the access current is increased to $I_{write}$ at time t3 and is held at $I_{write}$ until t5. With reference to FIG. 16B, at t3 the voltage across the MRAM cell 701 increases at t3. If the MRAM cell 701 was in the HRS (line 1610), then the voltage across the MRAM cell will increase to the level indicated by line 1620 at t3 and stay there until t5. Recall that the HRS is the AP-state. Thus, this MRAM cell will stay in the AP-state.

If the MRAM cell 701 was in the LRS (line 1612), then the voltage across the MRAM cell will increase to the level indicated by line 1622 at t3. Recall that the LRS is the P-state. If the MRAM cell 701 was in the P-state, it will switch to the AP-state. FIG. 16B shows line 1622 increases at t4 to meet with line 1620. This represents the MRAM cell has switched from the P-state (LRS) to the AP-state (HRS). It will be understood by one reasonably skilled in the art that the actual voltage sensed is past the cell and decoders, a so-call globally decoded node that goes to the sense amp. And the current is applied to this global node to drive the memory cell through the word line decoder to the memory bit and the other side of the memory bit is held near ground through the bit line decoder driver N channel transistor with source to ground.

Returning again to FIG. 15, step 1506 includes driving a second read current through each selected word line while applying a select voltage to the selected bit line in order to drive the second access current through each selected MRAM cell. In one embodiment, the second access current has the same direction and substantially the same magnitude as the first access current. With reference to FIG. 13, $I_{access}$ is driven by current driver 1210b through selected first conductive line 1206b to drive $I_{access}$ through memory cell 701b. At about the same time, $I_{access}$ is driven by current driver 1210g through selected first conductive line 1206g to drive $I_{access}$ through memory cell 701e. With reference to FIG. 13, $V_{select}$ is applied by voltage driver 1212b to second conductive line 1208b. In one embodiment, $I_{access}$ is 15 μA and $V_{select}$ is 0V.

FIGS. 16A and 16B will now be discussed with respect to one MRAM cell 701 to further elaborate on step 1506. With reference to FIG. 16A, the access current is decreased from $I_{write}$ to $I_{read}$ at time t5 and is held at $I_{read}$ until t6. With reference to FIG. 16B, the voltage across the memory cell 701 decreases at t5 to the level indicated by 1630 and holds at that level until t6. Note that line 1630 is at the HRS level. Also recall that regardless of the initial state of the MRAM cell, the MRAM cell was placed into the HRS state (AP-state) in step 1504.

Returning again to FIG. 15, step 1508 includes determining a pre-read state of each selected MRAM cell based on a comparison of a first voltage on each selected word line from driving the first read current through the selected word line to a second voltage on each selected word line from driving the second read current through the selected word line.

FIGS. 16A and 16B will now be discussed with respect to one MRAM cell 701 to further elaborate on step 1508. The first voltage on the selected word line from applying the first read current will be the voltage between t2 and t3. Hence, the first voltage is either the HRS level 1610 or the LRS level 1612. Note that this first voltage may be stored in step 1504 by, for example, charging a sense capacitor using the word line voltage. The second voltage on the selected word line from applying the second read current will be the voltage between t5 and t6. This second voltage will typically be at about the HRS level 1610. However, the second voltage could be slightly different from the HRS level 1610. Comparing the first voltage with the second voltage may thus be used to determine whether the MRAM cell was at the HRS level 1610 or the LRS level 1612 between t2 and t3.

Returning again to FIG. 15, after step 1508 the process 1500 has two options. Step 1510a is a read option. Step 1510a includes driving a write current through selected word lines 1206 to write back the original state of the memory cell, if needed. Recall that step 1504 placed all MRAM cells in the AP-state. Hence, all MRAM cells that were originally in the P-state are written back to the P-state, in step 1510a. All MRAM cells that were originally in the AP-state are left in the AP-state, in step 1510a.

Step 1510b is a write option. Step 1510b includes driving a write current through selected word lines 1206 to write the new state of the memory cell, if needed. As noted, step 1504 placed all MRAM cells in the AP-state. Hence, all MRAM cells that are to be written to the P-state, regardless of their original state, are written to the P-state, in step 1510b. All MRAM cells that are to be written to the AP-state are left in the AP-state, in step 1510b.

Figure 17:
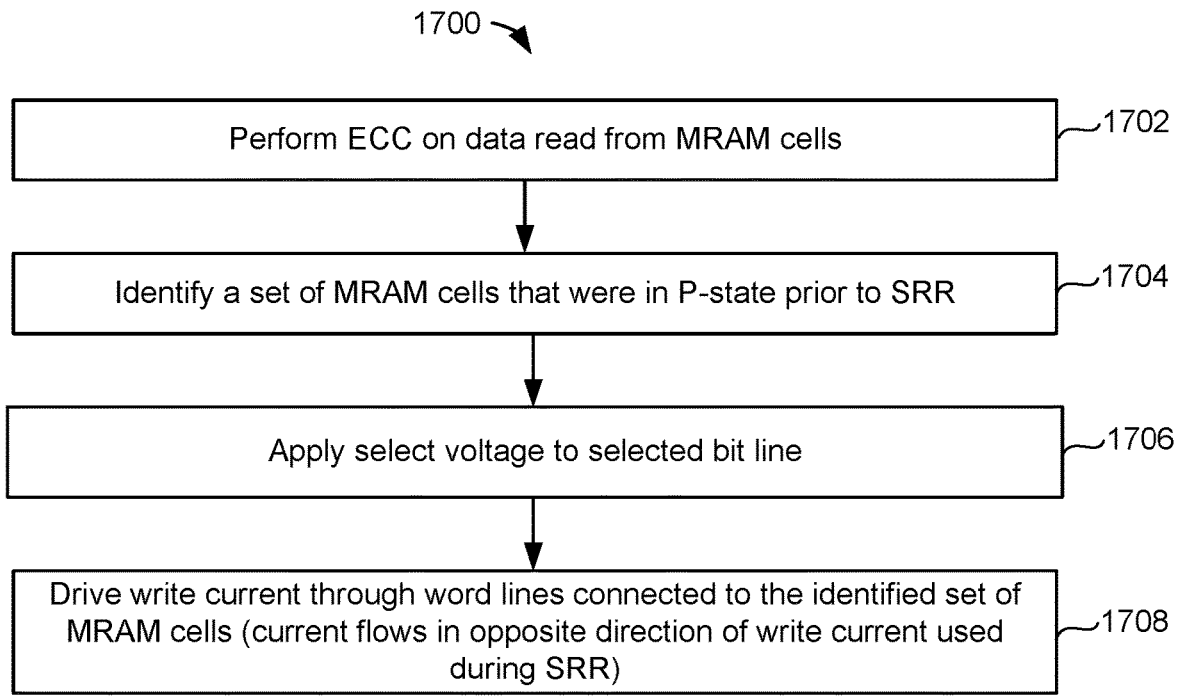
FIG. 17 depicts a flowchart of a process for writing back data to MRAM cells after a destructive SRR.

FIG. 17 depicts a flowchart of a process 1700 for writing back data to MRAM cells after a destructive SRR. Process 1700 provides further details for one embodiment of step 1510a. Step 1702 includes performing ECC on data that was read from the MRAM cells. Process 1500 may concurrently read multiple bits of a codeword from a single cross-point array. In some cases, other bits of the codeword are stored in other cross-point arrays. In one embodiment, system control logic 560/660 on either memory die 500 or control die 611 reads multiple cross-point arrays in order to obtain all of the bits of the codeword. In one embodiment, system control logic 560/660 sends the bits of the codeword to the memory controller 102, which decodes the codeword. In some embodiments, the control die 611 decodes the codeword. Regardless of where the decoding is performed, any errors in the data are corrected.

Step 1704 includes identifying a set of the MRAM cells that were in the P-state prior to the destructive SRR. In one embodiment, step 1704 is performed by system control logic 560/660 on either memory die 500 or control die 611. This identification may be made based on results of step 1508 of process 1500.

Step 1706 includes applying a select voltage to the selected bit line. Step 1708 includes driving a write current through word lines connected to the identified set of MRAM cells. In one embodiment, $I_{access}$ is −30 µA and $V_{select}$ is 0V. In step 1708, the current flows through the MRAM cells in the opposite direction as the current flowed in step 1504 of process 1500. Thus, whereas step 1504 was used to place MRAM cells into the AP-state, step 1708 is used to place MRAM cells into the P-state.

Figure 18:
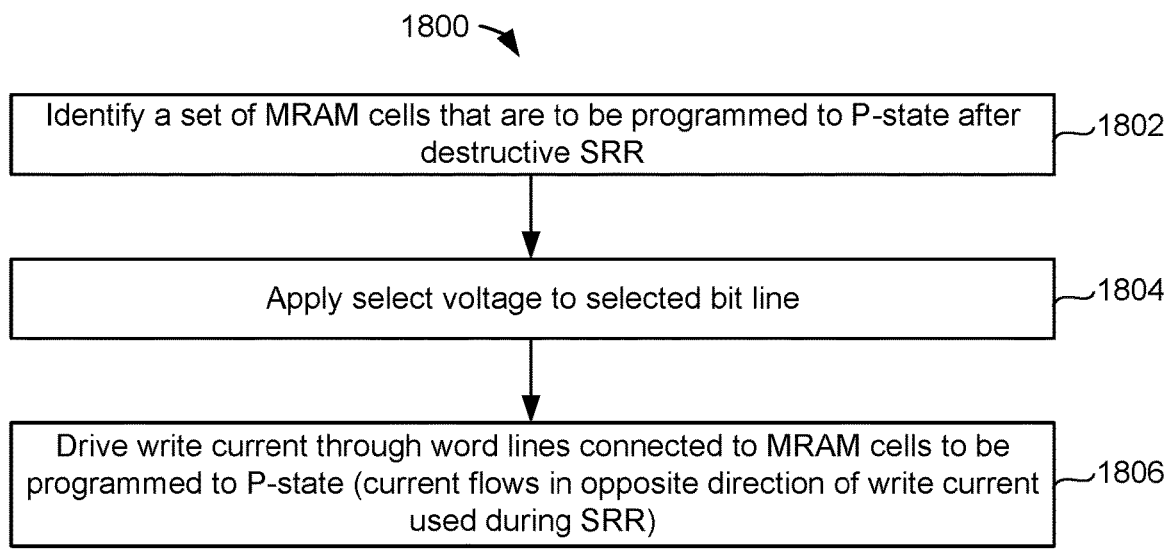
FIG. 18 depicts a flowchart of a process of a second stage of writing data to MRAM cells.

FIG. 18 depicts a flowchart of a process 1800 of a second stage of writing data to MRAM cells. Process 1800 provides further details for one embodiment of step 1510b. Step 1802 includes identifying a set of the MRAM cells that are to be programmed to the P-state after the destructive SRR. In one embodiment, step 1802 is performed by system control logic 560/660 on either memory die 500 or control die 611. This identification may be made based on data that is sent to the system control logic 560/660 by the memory controller 102. For example, the system control logic 560/660 may determine that MRAM cells to store a "0" are to be programmed to the AP-state and that memory cells to store a "1" are to be programmed to the P-state.

Step 1804 includes applying a select voltage to the selected bit line. Step 1806 includes driving a write current through word lines connected to the identified set of MRAM cells. In one embodiment, $I_{access}$ is −30 µA and $V_{select}$ is 0V. In step 1806, the current flows through the MRAM cells in the opposite direction as the current flowed in step 1504 of process 1500. Thus, whereas step 1504 was used to place MRAM cells into the AP-state, step 1806 is used to place MRAM cells into the P-state.

Figure 19A:
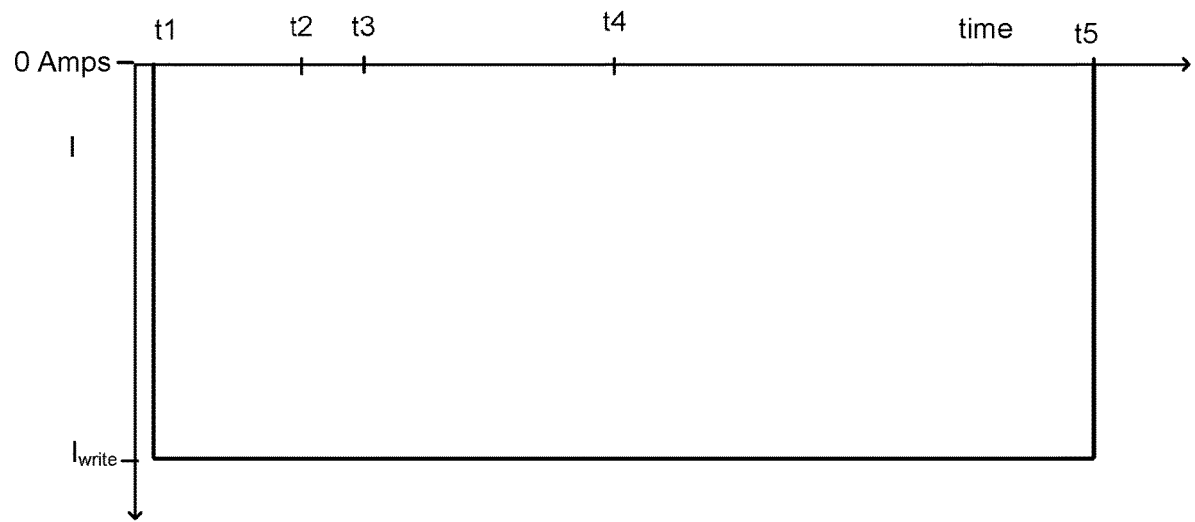
FIG. 19A depicts write current versus time for a write current that is provided to a selected word line.
Figure 19B:
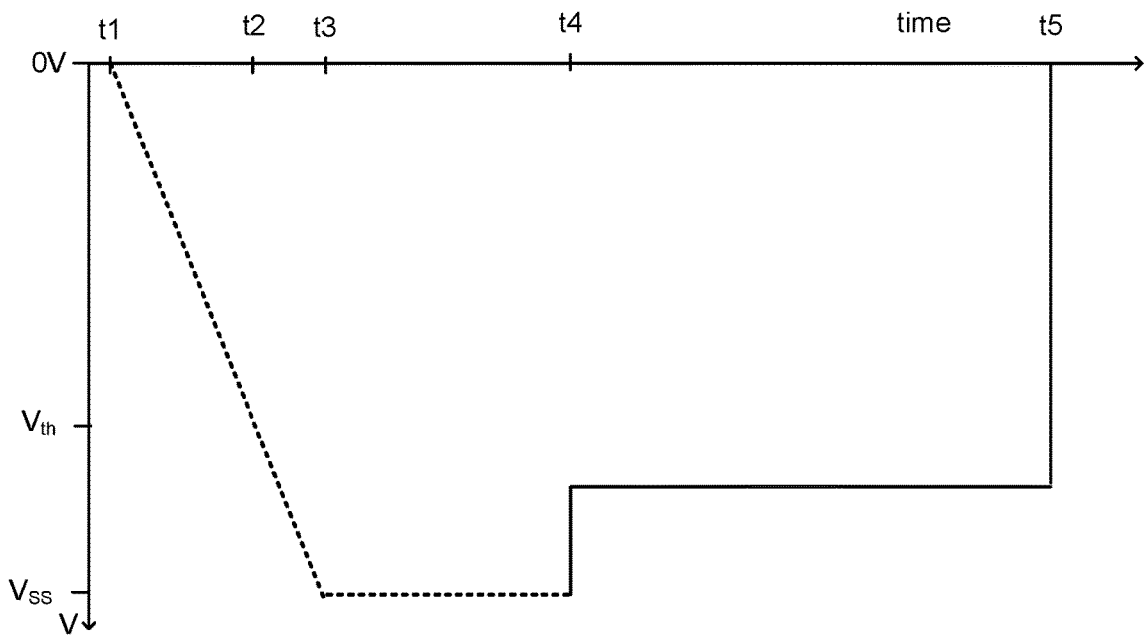
FIG. 19B depicts voltage across the MRAM cell versus time, and corresponds to FIG. 19A.

FIGS. 19A and 19B depict timing diagrams used during a write of MRAM cells. The timing diagrams can be applied to either process 1700 or 1800. FIG. 19A depicts current versus time for the current that is driven through a selected word line. FIG. 19B depicts voltage across the MRAM cell versus time. The timing diagrams are similar to those of FIGS. 16A and 16B and, in some embodiments, represent the timing that follows the timing diagrams for the SRR. Thus, for FIGS. 19A and 19B is assumed that the MRAM cell is in the AP-state at time t1. At time t1, the current provided to the selected word line drops from 0 A to the $I_{write}$ level. In FIG. 19A, $I_{write}$ is represented as a negative value. For example, whereas $I_{write}$ may be 30 µA in FIG. 16A, $I_{write}$ may be −30 µA in FIG. 19A. The access current is held at $I_{write}$ from t1 until t5. Note that, as defined herein, this negative magnitude access current may flow from the selected word line 1206 to the current driver 1210. In other words, the current driver 1210 sinks the access current in the example of FIG. 19A. As defined herein, this is an example of driving a negative current through the word line.

With reference to FIG. 19B, between t1 and t3, the voltage across the MRAM drops from 0V to $V_{ss}$. The threshold switching selector 1204 is off between t1 and t2. Once the voltage across threshold switching selector 1204 reaches the threshold voltage $V_{th}$ of the threshold switching selector 1204, it will turn on and switch to a low resistance state (at t2). After the threshold switching selector 1204 turns on the voltage across the MRAM cell may continue to decrease. By time t3, the voltage across the MRAM cell is at a steady state value ($V_{ss}$). Also, after time t2, all of $I_{write}$ passes through the MRAM cell. At time t4 the MRAM cell switched from the AP-state to the P-state. Because the P-state is a lower resistance state than the AP-state, the absolute magnitude of the voltage across the MRAM cell drops at t4. In other words, the voltage across the MRAM cell moves closer to 0V at t4.

In one embodiment, MRAM cells in a cross-point array are concurrently written by first concurrently writing all selected MRAM cells in the cross-point array to the AP-state. Then, a set of the selected MRAM cells are concurrently written from the AP-state to the P-state. This technique can be modified to first concurrently write all selected MRAM cells in the cross-point array to the P-state. Then, a set of the selected MRAM cells are concurrently written from the P-state to the AP-state.

Figure 20:
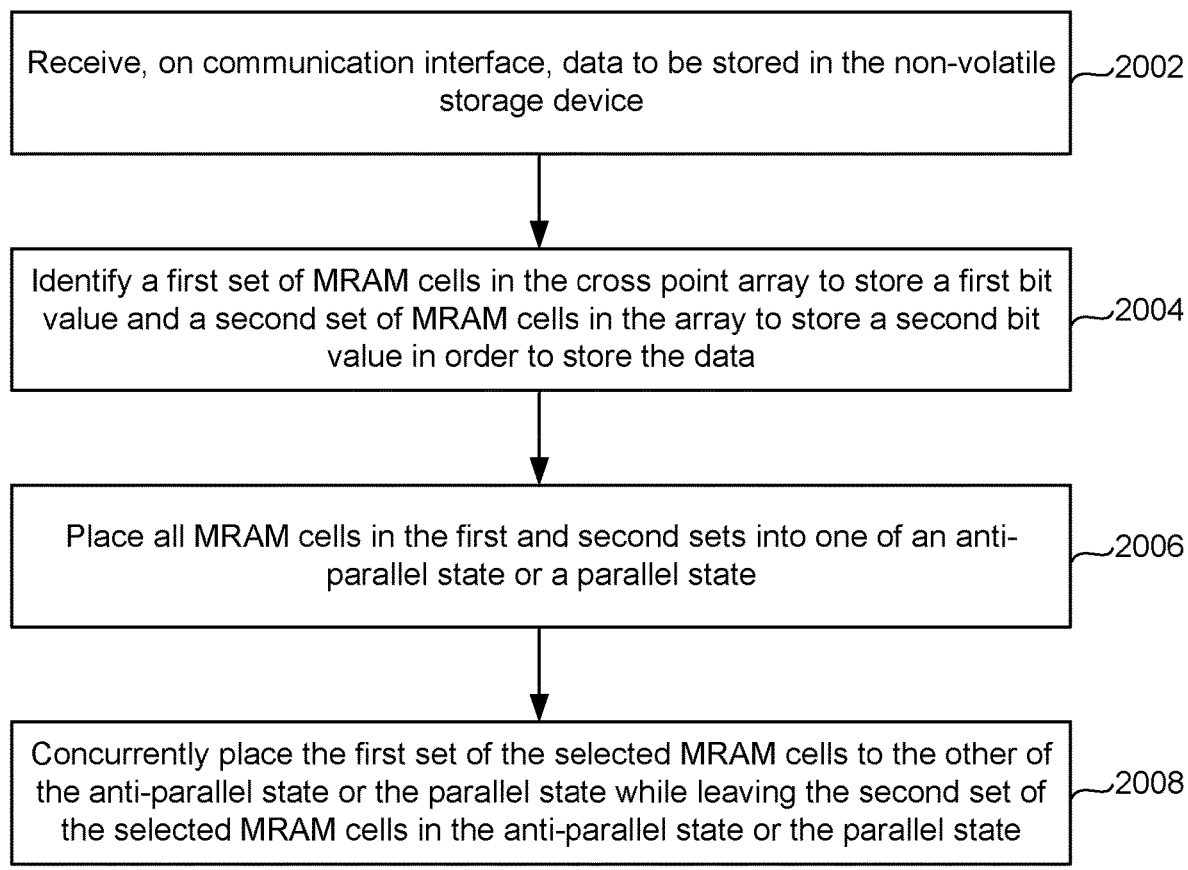
FIG. 20 is a flowchart of a process of concurrently writing MRAM cells in which all selected MRAM cells are first written to one of the AP-state or the P-state.

FIG. 20 is a flowchart of a process 2000 of concurrently writing MRAM cells in which all selected MRAM cells are first written to one of the AP-state or the P-state. In one embodiment, the process 2000 is performed by a control circuit in the memory die 500. In one embodiment, the process 2000 is performed by a control circuit in the control die 611.

Step 2002 includes receiving, on a communication interface 568/668, data to be stored in the non-volatile storage device. In one embodiment, the memory die 500 receives the data from the memory controller 102. In one embodiment, the control die 611 receives the data from the memory controller 102.

Step 2004 includes identifying a first set of MRAM cells 701 in the cross-point array to store a first bit value and a second set of MRAM cells 701 in the cross-point array to store a second bit value in order to store the data. The first set of MRAM cells 701 and the second set of MRAM cells 701 represent all selected MRAM cells 701 in the cross-point array. In one embodiment, the first bit value is a "1" and the second bit value is a "0". In one embodiment, the first bit value is represented by the AP-state and the second bit value is represented by the P-state. Thus, a "1" may be represented by the AP-state and a "0" may be represented by the P-state; however, this mapping can be reversed.

Step 2006 includes placing all MRAM cells 701 in first and second sets into one of the AP-state or the P-state. Thus, either all selected MRAM cells 701 in the cross-point array are placed into one of the AP-state or the P-state. By this it is meant that either all selected MRAM cells 701 in the cross-point array are placed into the AP-state or, alternatively, all selected MRAM cells 701 in the cross-point array are placed into the P-state. In one embodiment, step 2006 includes performing at least a portion of an SRR. For example, step 2006 may include performing at least steps 1502-1504 of process 1500. In one embodiment, steps 1502-1506 are performed. In one embodiment, steps 1502-1508 are performed.

Step 2008 includes concurrently placing the first set of MRAM cells to the other of the AP-state or the P-state while leaving the second set MRAM cells in the one of the AP-state or the P-state. In one embodiment, the first set of MRAM cells has two of more cells, and the second set of MRAM cells has zero or more cells. In one embodiment, the first set of MRAM cells has zero of more cells, and the second set of MRAM cells has two or more cells. In one embodiment, the first set of MRAM cells has one of more cells, and the second set of MRAM cells has one or more cells.

The following two examples will be used to expand on steps 2006 to 2008. As one example, both the first and second sets of MRAM cells 701 in the cross-point array are placed into the AP-state in step 2006. In step 2008 of the first example, the first set of MRAM cells are written from the AP-state to the P-state, while leaving the second set of MRAM cells in the AP-state. As a second example, both the first and second sets of MRAM cells 701 in the cross-point array are placed into the P-state in step 2006. In step 2008 of the second example, the first set of MRAM cells are written from the P-state to the AP-state, while leaving the second set of MRAM cells in the P-state.

Figure 21A:
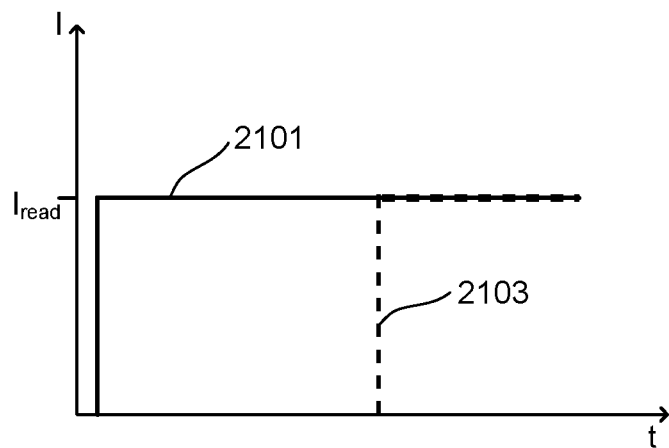
FIGS. 21A and 21B are an embodiment of a set of waveforms respectively for the current and the voltage for the layer 1 cell of FIGS. 11A and 11B in a read operation.
Figure 21B:
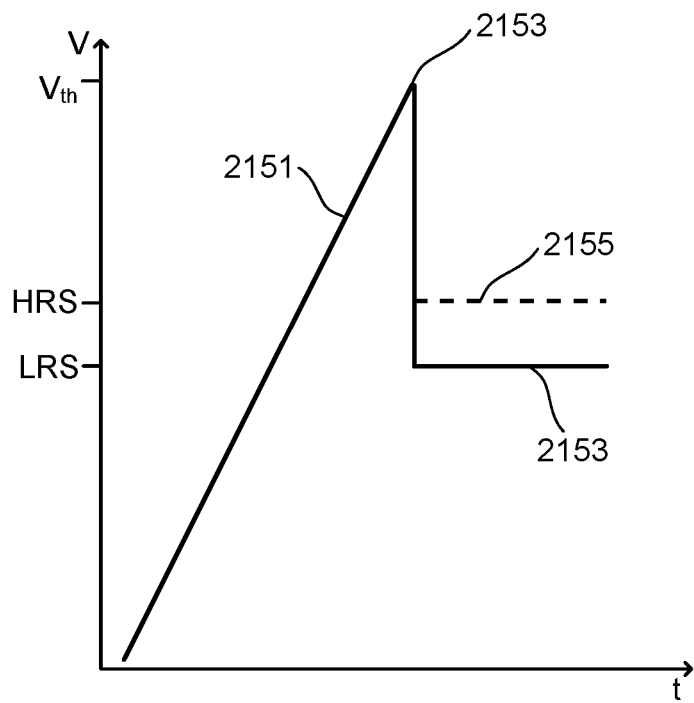
Figure 22:
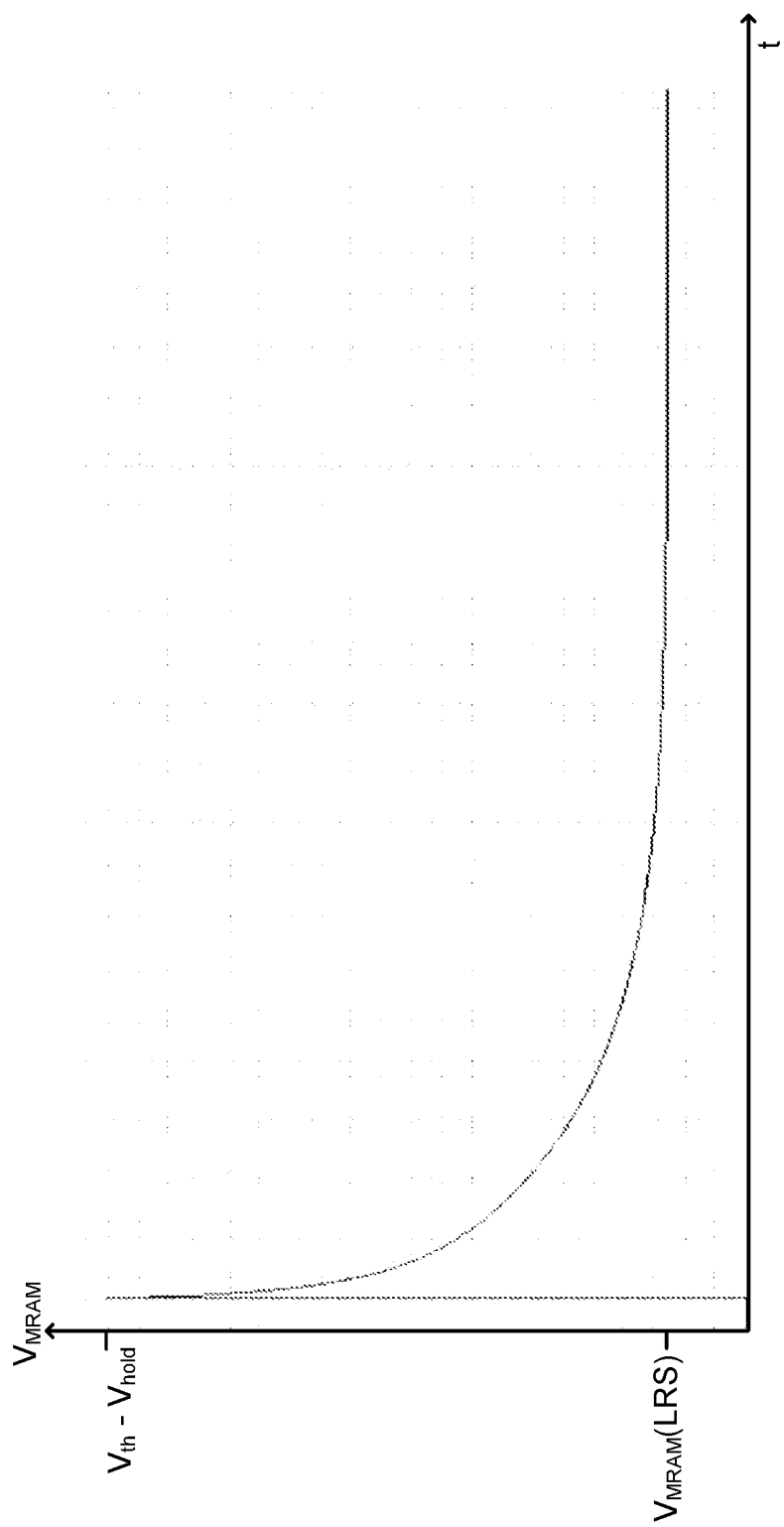
FIG. 22 shows an example of the voltage the MRAM device as the threshold switching selector switches from an off state to an on state.

As discussed above, to either read data from or write of data to an MRAM memory cell involves passing a current through the memory cell. In embodiments where a threshold switching selector is placed in series with the MRAM device, before the current can pass through the MRAM device the threshold switching selector needs to be turned on by applying a sufficient voltage across the series combination of the threshold switching selector and the MRAM device. FIGS. 21A, 21B, and 22 consider this activation of the threshold switching selector in more detail in the context of a read operation.

FIGS. 21A and 21B are an embodiment of a set of waveforms respectively for the current and the voltage for the layer 1 cell of FIGS. 11A and 11B in a read operation, where the time axes of FIGS. 21A and 21B are aligned and at the same scale. Relative to FIGS. 16A and 16B, FIGS. 21A and 21B consider the interval up to time t3. In this embodiment for a read operation the read is performed in the P2AP direction in which word line 1 1100/1150 is biased high and the bit line 1110/1160 is set low (e.g., 0V) so that the (conventional) current flows upward, passing through the reference layer 1105/1155 before passing through the free layer 1101/1151. (In terms of electron current, as opposed to conventional current, the electron flow will be as illustrated in FIG. 10B.)

In the embodiment of FIGS. 21A and 21B, a forced current approach is used, with the memory driven from the reference layer side with a read current, $I_{read}$ from a current source in the driver circuitry for the line. As shown FIG. 21A by the solid line 2101, the current is raised to the $I_{read}$ value and held there for the duration of the current read operation. This current will move the lines supplying the current to the selected memory cell, such as word line 1 1100/1150 for the layer 1 memory cell in FIGS. 11A/B, and also support any leakage in the path. As shown at 2151 in FIG. 21B, the current across the parallel combination of the threshold switching selector and the resistive MRAM element ramps up as the threshold switching selector is in an off state. Once the voltage across threshold switching selector reaches the threshold voltage $V_{th}$ of the threshold switching selector at 2153, it will turn on and switch to a low resistance state.

Once the threshold switching selector is in the on state, the $I_{read}$ current will flow through the selected memory cell. This is illustrated by the broken line 2103 of FIG. 21A that resents the current through memory cell, jumping from zero to $I_{read}$ when the threshold switching selector switches on at 2153. As the current level is held fixed at $I_{read}$, the voltage across the memory cell will drop to a level dependent upon the series resistance of the MRAM device and the on-state resistance of the threshold switching selector. For a binary embodiment, the memory cell will have a high resistance anti-parallel state and a low resistance parallel state. The resultant voltage across the series connected MRAM device and threshold switching selector in response to the $I_{read}$ current for the high resistance state (HRS) and low resistance state (LRS) are respectively shown as 2155 and 2153. The resultant voltage difference can then be measure by a sense amplifier to determine the data state stored in the memory cell. Although the discussion here is in the context of an MRAM based memory cell being placed in series with the threshold switching selector, this read technique can similarly be applied to other programmable resistance memory cells, such as PCM or ReRAM devices.

FIG. 21B shows the voltage applied to the ramping up at 2151 until it reaches $V_{th}$ at 2153, then dropping down to either the high resistance state level at 2155 or the low resistance state at 2153. In an actual device, due resistance and capacitances, there will be some delay as the voltage spike at 2153 drops down to either 2155 or 2153. This is illustrated by FIG. 22 for the example of a low resistance state.

FIG. 22 shows an example of the voltage across the MRAM device as the threshold switching selector switches from an off state to an on state. Relative to FIG. 21B, FIG. 22 shows the voltage $V_{MRAM}$ across just the MRAM device, while FIG. 21B represents the voltage across the series combination of the threshold switching selector and the MRAM device. Initially, before the threshold switching selector turns on, the voltage across the MRAM device will be zero as the applied voltage ramps up to the $V_{th}$ voltage. Once the threshold switching selector turns on, current begins to flow through the MRAM device and the voltage across the MRAM device will spike to the $V_{th}$ level, less the voltage $V_{hold}$ dropped across the threshold switching selector. Consequently, $V_{MRAM}$ will jump from 0V to $\Delta V=(V_{th}-V_{hold})$, after which it will decay down to the voltage drop across the MRAM device in its resistance state in response to the applied $I_{read}$; e.g. $I_{read} \times R_{MRAM}$. For LRS of 25KΩ and read current of 15 ua, the voltage across the MRAM device $V_{MRAM}$ will be 375 mV. Whereas for HRS of 50KΩ, the $V_{mram}$ will be 750 mV (unless compliance V is reached which limits the voltage at a clamp voltage). The difference of 375 mV, for example, can be sensed by adjusting the stored level by a threshold amount, such as by 150 mV.

The rate at which the $V_{MRAM}$ voltage drops down to near the asymptotic $V_{MRAM}$ level depends on size of the spike from the "snapback voltage" $\Delta V$, which is the difference between $(V_{th}-V_{hold})$ and $V_{MRAM}$, and the rate at which charge can flow out of the device, which depends upon the R—C characteristics of the memory cell and the lines between which it is connected between. This behavior has some practical consequences for the operation of the memory cell.

A first consequence is that both the low resistance state and the high resistance state will decay as shown in FIG. 22, where FIG. 22 shows the low resistances state. The high resistance state will show similar behavior, but with a higher asymptotic state. In order to distinguish between these two states, they need to be separated by a sufficient margin, so that a sensing operation cannot be performed until after enough time has passed in order for the two states to have well-defined and differentiable voltage levels.

Another consequence is that the excess current spike can disturb the data stored in the memory cell. As discussed with respect to FIGS. 10A and 10B, the state of an MRAM memory can be changed by passing a current through the memory cell, so that if the voltage across and/or current through a memory cell is high enough for long enough, it will, depending on the current's direction, change a parallel state to an anti-parallel state (a P2AP write), as illustrated in FIG. 10B, or change an anti-parallel state to a parallel state (an AP2P write), as illustrated in FIG. 10A. For example, the read process of FIGS. 21A and 21B is described as performed in the P2AP direction, so that a disturb by the waveform of FIG. 22 could switch a low resistance state memory cell to the high resistance state before the stored data state can be determined.

As noted above, the threshold switching selector controls access to the memory cells. In particular, to apply a voltage or current to a memory cell to read or change its resistance state, the corresponding selector must first be switched to a conductive state by applying a sufficiently high voltage, e.g., a voltage which is higher in magnitude than the operating threshold voltage $V_{th}$. When the selector is in a non-conductive state, e.g., when a voltage across the selector is lower in magnitude than the operating threshold voltage, the memory cell is isolated and retains its existing resistance state since the MRAM voltage is a ratio of $[R_{MRAM}/(R_{MRAM}+R_{selector})] \times V_{applied} = V_{MRAM}$. Where the non-conducting $R_{selector}$ (>1MΩ for example) is much greater than the $R_{MRAM}$ (<100Ω for example), the $V_{MRAM}$ is adequately low until the selector turns on and its resistance is lowered, for example to 1KΩ.

Consequently, the selection of an MRAM memory cell to read its data content involves turning on the corresponding threshold switching selector, which has a snapback of $\Delta V$ from $V_{th}$ to $V_{hold}$. This transient is induced fast since an OTS turn-on for example is under 1 nsec, and that the $V_{selector}$ difference is impressed across the MRAM device and decays in a time determined by the threshold switching selector and MRAM's internal resistance, and the capacitance across the array node (e.g., wire to wire capacitance and the capacitance of the transistor and other elements in the drivers) and the series resistance to these capacitive elements. As this transient can result in a disturb of the data state stored in memory cell, and since the memory cell cannot be sensed until the transient sufficiently subsides, the more quickly that this excess voltage can be bled off, the lower will be the amount of read disturb and the more quickly a read operation can be completed.

If, in a multi-layer cross-point array structure such as is illustrated in FIG. 7D, the orientation of the MRAM device in the upper layer 720 is the same as in the lower layer 718, (such as illustrated in the embodiment of FIG. 11A,) during a read in the P2AP direction as described above for the self-reference read (SRR) process, the current will be flowing in different directions in the two layers. More specifically, when reading in the P2AP direction with the orientation of the MRAM 1102 and MRAM 1112 as shown in FIG. 11A, the current flows in the upward direction for both the layer 1 cell and the layer 2 cell. Consequently, when performing a read in the P2AP direction for the layer 1 memory cell, word line 1 1100 will be set to a high voltage level and bit line 1110 set to a low voltage level, while when reading in the P2AP direction for the layer 2 memory cell, bit line 1110 will be set to a high voltage and word line 2 1120 set to a low voltage. Notice that this requires the bit line 1110 of FIG. 11A to be biased low, to serve as a current sink, when reading layer 1 in the SRR process; but when reading in layer 2 in an SRR process, the bit line 1110 is instead biased high to serve as a current source. This prevents the concurrent reading of the layer 1 memory cell and the layer 2 memory cell.

When forming a multi-layer memory structure such as illustrated in FIG. 7D or 11A, it is preferable, from a processing perspective, that each of the layers are formed in the same way so only 1 module is required. For example, looking at FIG. 11A, after forming the first set of conductive lines (word line 1 1100) over a substrate (not shown), a processing module can form the threshold switching selector, reference layer, tunnel barrier, and free layer (respectively 1109, 1105, 1103, and 1101) in sequence. After then forming a second set of conductive lines (bit line 1110), the memory cell processing module can then be repeated to form the threshold switching selector, reference layer, tunnel barrier, and free layer (respectively 1119, 1115, 1113, and 1111). The repetition of the same set of steps for each subsequent layer simplifies the processing, particularly as the MRAM structures 1102 and 1112 are represented in simplified form and an actual processing module for these elements is more involved.

Although forming all of the MRAM layers with the same orientation is typically preferable, reversing the orientation of the MRAM device of alternate layers can provide a number of advantages. FIG. 11B illustrates an embodiment where the layer 2 memory cell has been inverted relative to FIG. 11A, so that in an SRR operation current is forced from word line 1 1150 to bit line 1160 when reading layer 1 memory cells and from word line 2 1170 to bit line 1160 when reading layer 2 memory cells. This allows the same bias level to be used on bit line 1160 when reading from either level and also allows for a concurrent reading of both level's memory cells in the sort of concurrent access of multiple memory cells described above with respect to FIGS. 14, 15, and subsequent figures. Alternately, the layer 1 memory cells of FIG. 11A could have an inverted orientation, with current being forced from bit line 1110 to word line 1 1100 and/or word line 2 1120 in an SRR reading operation. Although reversing of the orientation of either layer can allow for the same biasing of the bit line 1110 when reading either level's memory cell, which of the two layers is inverted can affect how quickly the sort of transient voltage illustrated in FIG. 22 can be dissipated.

Figure 23:
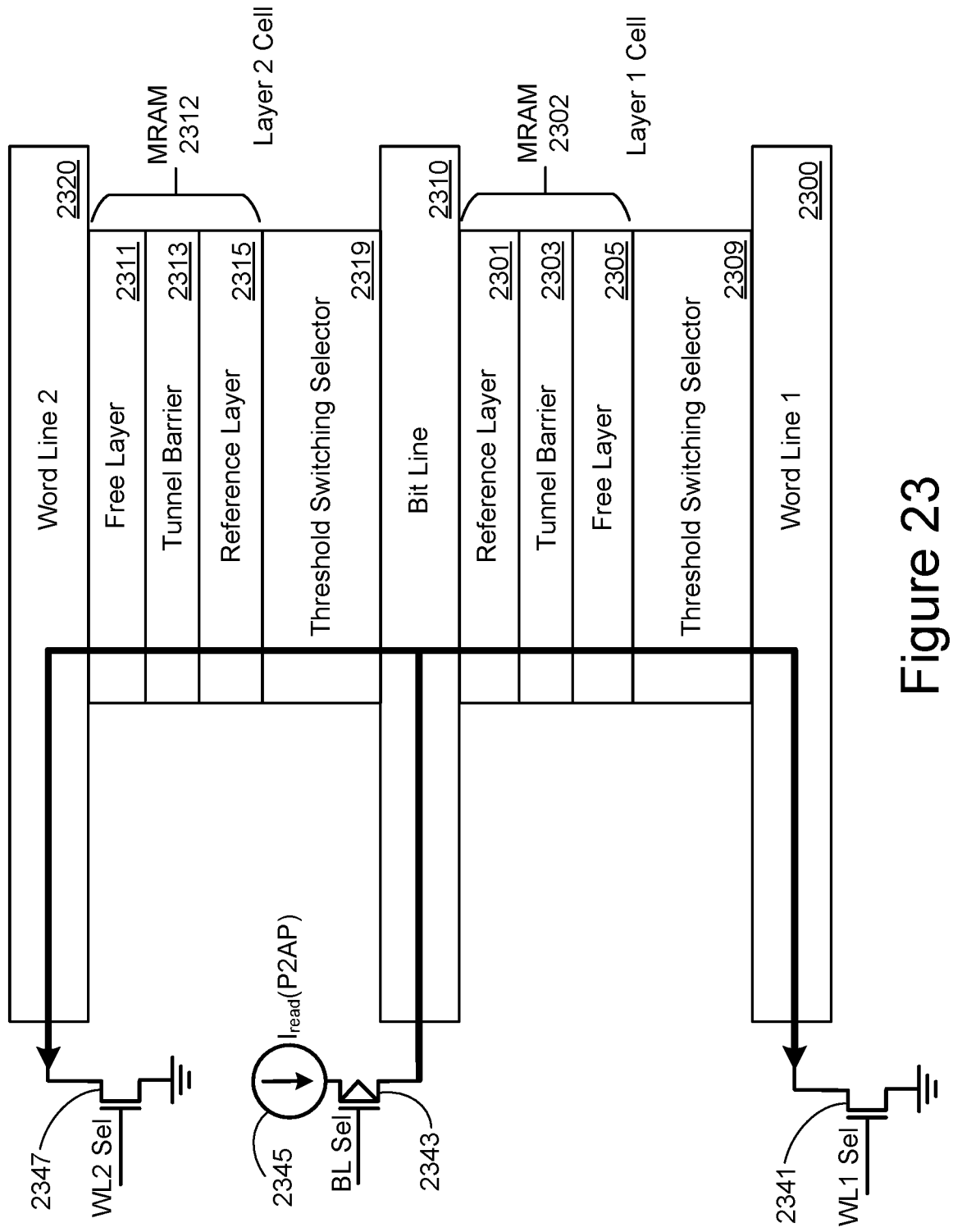
FIG. 23 illustrates a two layer embodiment of a cross-point memory architecture in which the MRAM devices in the lower layer are inverted relative to the upper layer in order to minimize capacitance in a read operation.

As discussed above, how quickly the transient spike generated across the MRAM element when the threshold switching selector turns on depends on the resistance and capacitance along the path through which this voltage spike discharges. For example, going back to FIG. 11A where the orientation is the same in both layer 1 and layer 2, word line 1 1100 is pulled high for an SRR read in layer 1 while word line 2 is pulled low for an SRR read in layer 2. Referring to the word line drivers 1210a-1210h of FIG. 12 or 13, pulling a word line high for the lower level can be implemented through use of a P channel device, while pulling a word low for the upper level can be implemented through use of an N channel device. Whether based on a PMOS pull-up transistor or an NMOS pull-down transistor, the capacitance of such a driver is largely proportional to it size. NMOS devices can be formed in a smaller size than a PMOS device for given amount of drive resistor requirement. Consequently, in a array structure as illustrated in FIG. 12 or 13 where the word lines are shorter than the bit lines, the transient across the MRAM device illustrated in FIG. 22 can most rapidly be discharged by way of a word line selected through use of an N channel device pulling towards ground, and the bit line for selection of either the lower or upper layer is pulled to near the positive power supply, for example 3.3V for reading P2AP. Consequently, to allow both layers to select a word line as in the upper layer of FIG. 11A, the orientation of the lower level MRAM device can be inverted as illustrated in FIG. 23. Such an arrangement can significantly reduce the bit error rate when reading data, as read disturbs are reduced, and also allow from improved performance in read latency times.

FIG. 23 illustrates a two layer embodiment of a cross-point memory architecture in which the MRAM devices in the lower layer are inverted relative to the upper layer in order to minimize capacitance in a read operation. FIG. 23 repeats the elements of FIG. 11A and are similarly numbered (e.g., word line 1 1100 is now 2300), but with the layers MRAM component of the layer 1 cell reversed.

More specifically, in FIG. 23 the layer 1 memory cell is formed between the lower conducting line of word line 1 2300 and the intermediate conducting line of bit line 2310. MRAM device 2302 now has its reference layer 2301 formed over the tunnel barrier 2303, which is in turn formed over the free layer 2305. This is reversed relative to layer 1 MRAM device 1101 of FIG. 11A, so that the layer 1 memory cell is sensed by forcing current through the MRAM device 2302 from the bit line 2310. This is represented by the heavily weighted arrow the flows from the bit line 2310 to the word line 1 2300. In the embodiment of FIG. 23 the threshold switching selector 2309 is still below the MRAM device 2302, allowing the processing sequence related to forming this element to be the same in both layers, but alternate embodiments reverse the order of the MRAM device 2302 and threshold switching selector 2309.

In layer 2, the memory cell between word line 2 2320 and bit line 2310 is oriented as in FIG. 11A, with free layer 2311 formed over tunnel barrier 2313, which is in turn formed over reference layer 2315 with the threshold switching selector 2319 underneath. As with the layer 1 memory cell, the layer 2 memory cell is sensed by forcing current through the MRAM device 2312 from the bit line 2310. This is represented by the heavily weighted arrow the flows from the bit line 2310 to the word line 2 2320.

FIG. 23 also schematically represents the select and driver circuitry for word line 1 2300, bit line 2310, and word line 1 2320. Referring back to FIGS. 12 and 13, these elements can be considered part of one of either the word lines drives 1210a-1210h or bit line drivers 1212a-1212d. As represented by the heavily weighted arrows, in a read operation in the P2AP direction, the read current is driven from bit line 2310 to one or both of word line 1 2300 and word line 2 2320. The current $I_{read}(P2AP)$ can be provided by a current source 2345, which can be based on a current mirror, for example, that connects to a supply level. The current source 2345 supplies the read current $I_{read}(P2AP)$ to the bit line 2310 by PMOS device 2343, which receive a decoding control signal BL Sel to select bit line 2310. The read current is discharged from word line 1 2300 and word line 2 2320 by respective NMOS devices 2341 and 2347, which receive respective decoding control signals WL1 Sel to select word line 1 2300 and WL2 Sel to select word line 2 2320.

Leakage in the threshold switching devices is reduced by increasing the threshold voltage ($V_{th}$), and the widest allowed $V_{th}$ range is obtained when using a P channel pullup device on one of the word lines or the bit line for the memory cell, and an N channel pulldown on the other of the word lines and the bit line in order to avoid $V_{th}$ drops. In the two layer embodiments mainly being described here, bit lines tend to be the larger capacitance due their placement between the two separate word lines and also because, in embodiments such as illustrated with respect to FIGS. 12 and 13, bit lines tend to have a longer length. Consequently, the rate at which the transient voltage spike when a threshold selecting switch can be dissipated is mainly determined the word line's R—C characteristics. One way the bleed-off time and read latency can be reduced is by lowering capacitance through shortening conductive wire lengths and increasing array wire-to-wire spacing, but both of these techniques decrease memory densities. Another way the bleed-off time and read latency can be reduced, and without adversely affecting memory density, is by the reduction in the size of the transistors used to drive the conductive wires. By using the smaller sized NMOS devices 2341 and 2347 for the word lines 2300 and 2320, and using the larger sized PMOS device 2343 on the bit line 2310, the capacitance of primary path for dissipating the transient voltage can be reduced without decreasing array density.

Referring back to the self-reference read process illustrated in FIGS. 16A and 16B, in both of the sensing operations between t1-t3 and t5-t6, the current flow is as illustrated in FIG. 23 and both use $I_{read}$. For the write at t3-t5, where all of the memory cells are placed into the high resistance AP state, the current is also in P2AP direction as illustrated in FIG. 23, but using a current source with $I_{write}$ for the forced current. Consequently, in the embodiment of FIG. 23, the array can be operated with the bit line 2310 consistently pulled high by the PMOS device 2343, with the current source 2345 switched to $I_{write}$ during the interval t3-t5, and the word lines 2300 and 2320 consistently pulled low by the NMOS devices 2341 and 2347. Only when writing selected memory cells back to the low resistance parallel state (AP2P) as illustrated FIGS. 19A and 19B are these biases reversed, with a selected bit line 2310 being taken low and a selected word line of one or both or word lines 2300 and 2320 taken high to drive $I_{write}$ through a selected memory cell in the AP2P direction. Note that as both the layer 1 and layer 2 memory cells are biased in the same direction for each of the sub-operations of the SRR process, this allows for embodiments in which these operations are performed in parallel for both layers.

Figure 24:
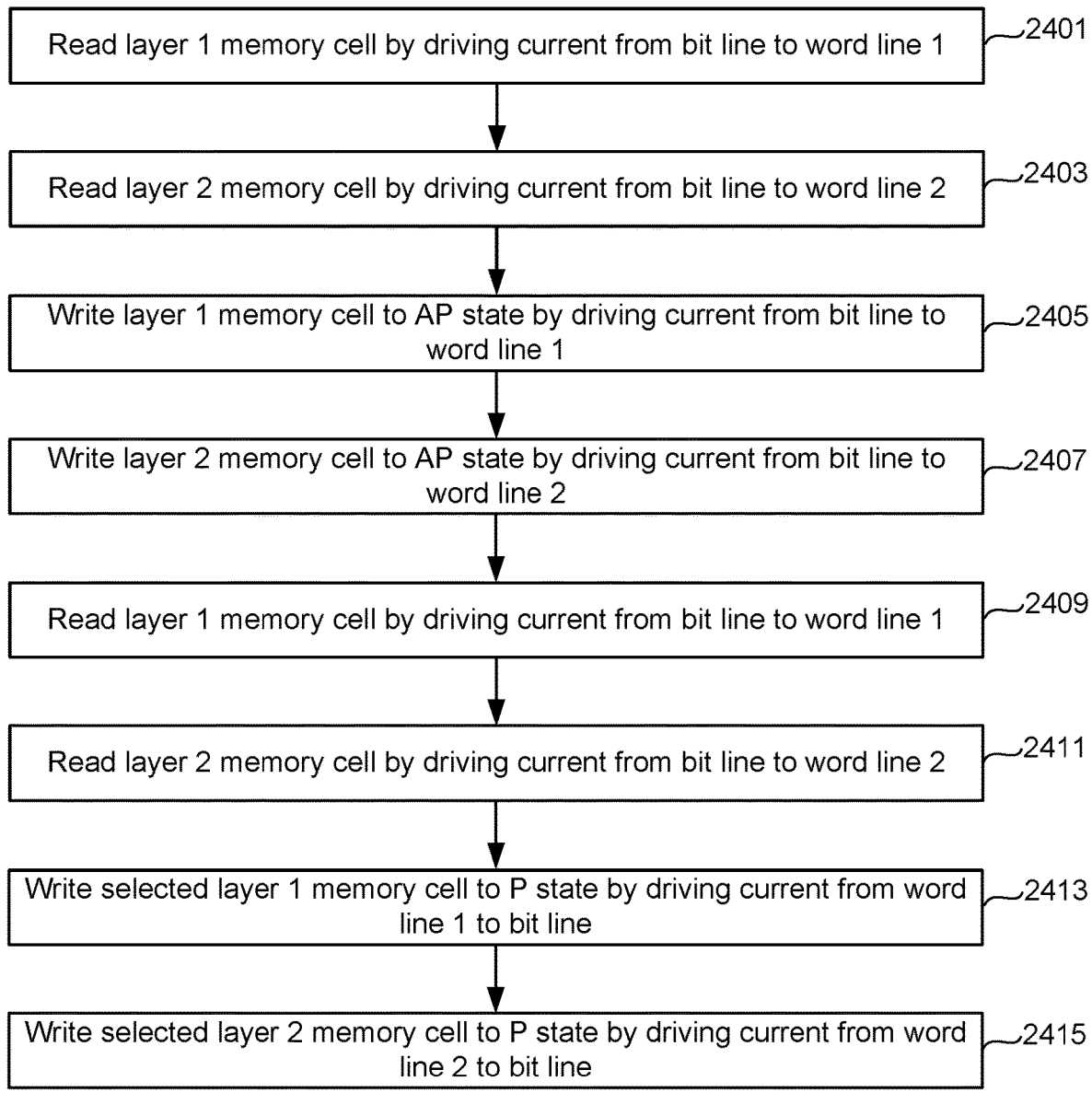
FIG. 24 is a flowchart of an embodiment for performing a self-reference read using the structure of FIG. 23.

FIG. 24 is a flowchart of an embodiment for performing a self-reference read using the structure of FIG. 23. The flow describes an SRR process for both the layer 1 memory cell and the layer 2 memory cell, where the steps alternate between the two layers. The two layers can be operated independently, so that only the layer 1 or layer 2 operations are performed, or they can be operated concurrently, so that a given layer 2 operation is performed concurrently with the corresponding layer 1 operation to read the data content of both layers at the same time, as described above for the concurrent read along multiple word lines.

At step 2401, the data content of the MRAM device 2302 of layer 1 is sensed by driving $I_{read}$ from bit line 2310 to word line 1 2300 by asserting the BL Sel signal to PMOS 2343 and asserting the WL1 Sel signal to NMOS 2341. The resistance state of the MRAM device 2302 can then be determined by the corresponding sense amplifier (i.e., one of SA 1228a-1228h). Similarly, step 2403 determines the data content of the MRAM device 2312 of layer 2 is sensed by driving $I_{read}$ from bit line 2310 to word line 2 2320 by asserting the BL Sel signal to PMOS 2343 and asserting the WL2 Sel signal to NMOS 2347, with the resistance state of the MRAM device 2312 determined by the corresponding sense amplifier (i.e., one of SA 1228a-1228h). As both of the layer 1 and layer 2 memory cells can be biased as in steps 2401 and 2403 at the same time, these sensing operations can be performed concurrently in some embodiments.

At step 2405, the MRAM device 2302 of layer 1 is written to the AP state by driving $I_{write}$ from bit line 2310 to word line 1 2300 by asserting the BL Sel signal to PMOS 2343 and asserting the WL1 Sel signal to NMOS 2341, but with the current source 2345 now supplying $I_{write}$. At step 2407, the MRAM device 2312 of layer 2 is written to the AP state by driving $I_{write}$ from bit line 2310 to word line 2 2320 by asserting the BL Sel signal to PMOS 2343 and asserting the WL1 Sel signal to NMOS 2347, with the current source 2345 now supplying $I_{write}$. As both of the layer 1 and layer 2 memory cells can be biased as in steps 2405 and 2407 at the same time, these sensing operations can be performed concurrently in some embodiments. The second read of the SRR process can then follow at steps 2409 and 2411, which can be performed as respectively described above for steps 2401 and 2403.

If the MRAM element 2302 of the layer 1 memory cell is selected to be written to the low resistance parallel state, a AP2P operation is performed at step 2413 by driving the write current $I_{write}$ from word line 1 2300 to bit line 2310 (i.e., in the opposite direction than the preceding steps). Similarly, if the MRAM element 2312 of the layer 2 memory cell is selected to be written to the low resistance parallel state, a AP2P operation is performed at step 2415 by driving the write current $I_{write}$ from word line 2 2320 to bit line 2310. As both of steps 2413 and 2415 drive current from the corresponding word line into the same bit, these operations can be performed concurrently.

As noted in the preceding discussion of FIG. 24, as each pair of steps bias the bit line and the corresponding word line in the same way, these steps can be performed in parallel. Conversely, if only one of the layers is to be read, only the steps relevant to that layer can be performed.

Figure 25:
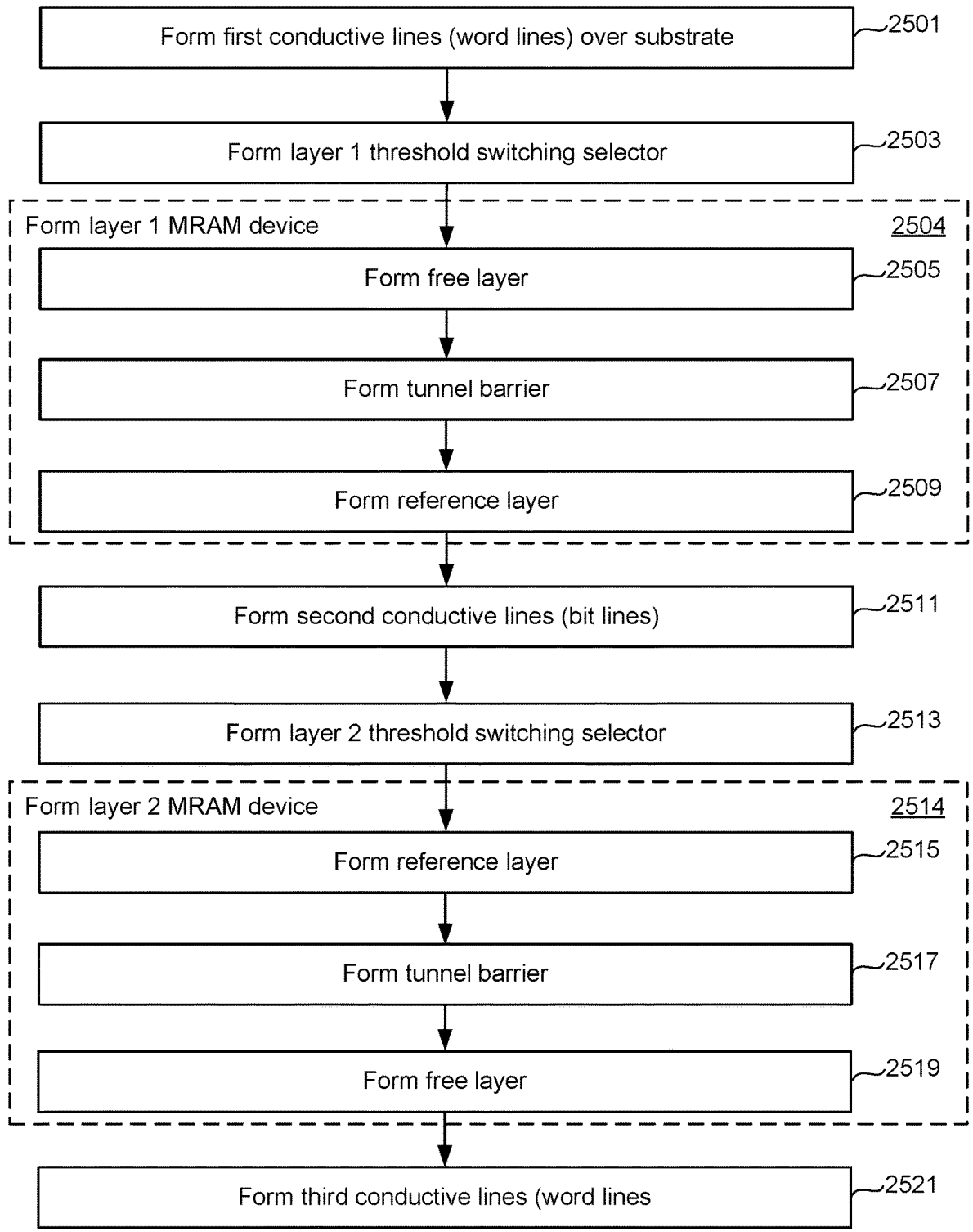
FIG. 25 is a flowchart of an embodiment for forming the structure of FIG. 23.

FIG. 25 is a flowchart of an embodiment for forming the structure of FIG. 23. Within each of the steps, the processing can be similar to processing that would be to form the structure FIG. 11A, but FIG. 25 highlights the change in the order of processing steps between layer 1 and layer 2. As noted above, FIG. 23 is simplified, with the only the free layer, tunnel barrier, and reference layer MRAM represented, while a more a detailed description would include that additional structure that is described above with respect to FIG. 9, for example.

At step 2501 a first set of conducting wires running in a first direction is formed over a substrate, which is not shown in FIG. 23. In the view of FIG. 23, the first conductive lines include word line 1 2300 and would correspond to the lower set of word lines in FIG. 7D. In the embodiment of FIG. 23 the threshold switching devices are formed below the MRAM device of each layer and threshold switching selector 2309 is formed at step 2503. In other embodiments, the threshold switching devices could be formed above the MRAM device in one or both of the layers. At step 2504 layer 1 MRAM device 2302 is formed. In the embodiment of FIG. 23 where the layer 1 MRAM device is inverted, step 2504 includes sequence of sub-steps of forming the free layer 2305 over the threshold switching selector 2309 at step 2505, the tunnel barrier 2303 is formed over the free layer 2305 at step 2507, and then step 2509 forms the reference layer 2301 over the tunnel barrier 2303.

At step 2511 the second set of conductive lines is formed over the layer 1 MRAM device 2302. The second layer of conductive lines includes bit line 2310 and corresponds to the bit lines of FIG. 7D. With the completion of step 2511, the memory structure of layer 1 is complete. In a cross-point architecture this second set of conductive lines run in a second direction over the substrate that is perpendicular to the first layer of conductive line (the bottom set of word lines). Although FIG. 23 (and FIGS. 11A and 11B above) represent both the word lines and bits as running left to right for purposes of discussion, when viewed in the larger structure one of these (either the bit lines or the two layers of word lines) would more accurately run into the page as represented in FIGS. 7B-7D.

The second layer is formed beginning at step 2513 that forms the layer 2 threshold switching selector 2319 over the second set of conductive lines (bit line 2310). In the processing sequence for the embodiment of FIG. 23, the layer 2 threshold switching selector is again formed under the MRAM device of the layer's memory cell, but, as in layer 1, other embodiments could reverse this. The layer 2 MRAM device 2312 is then formed in step 2514. The sub-steps of step 2514 reverse the order relative to layer 1: step 2515 forms reference layer 2315 over threshold switching selector 2319, step 2517 forms tunnel barrier 2313 over reference layer 2315, and step 2519 forms free layer 2311 over tunnel barrier 23313. The top layer of conductive lines, including word line 2 2320, is formed in step 2521 running over the underlying structure in the same direction as the bottom layer of conductive lines, including word line 1 2300. With 2521, the two layer structure of FIG. 23 is complete. If additional layers are to be formed, the process can continue in the same manner, alternating the processing module of layer 1 with that of module 2.

According to a first set of aspects, an apparatus includes a non-volatile memory having a substrate and one or more memory arrays formed on the substrate. Each of the arrays includes: a first set of conductive lines running in a first direction parallel to a surface of the substrate; a second set of conductive lines formed over the first set of conductive lines and running in a second direction parallel to the surface of the substrate; a third set of conductive lines formed over the second set of conductive lines and running in the first direction; and a first and second set of memory cells. Each of the first plurality of memory cells is connected between a corresponding one of the first set of conductive lines and corresponding one of the second set of conductive lines, each of the first plurality of memory cells including a threshold switching selector connected in series with a magnetoresistive random access memory (MRAM) device, the MRAM device of each of the first plurality of memory cells including: a reference layer having a fixed magnetic field polarity; and a free layer connected in series with the reference layer and having a programmable magnetic field polarity, where the free layer is formed below the reference layer. The second plurality of memory cells each is connected between a corresponding one of the second set of conductive lines and corresponding one of the third set of conductive lines, each of the second plurality of memory cells including a threshold switching selector connected in series with an MRAM device, the MRAM device of each of the plurality of memory cells including: a reference layer having a fixed magnetic field polarity; and a free layer connected in series with the reference layer and having a programmable magnetic field polarity, where the free layer is formed above the reference layer.

In additional aspects, a method includes sensing a data state of a selected one of a first plurality of memory cells by forcing a read current to a corresponding first conductive line from a second conductive line, the selected one of the first plurality of memory cells being part of an array including the first plurality of memory cells and a second plurality of memory cells, each of the first and the second pluralities of memory cells comprising a threshold switching selector connected in series with a magnetoresistive random access memory (MRAM) device. The method also includes sensing a data state of a selected one of the second plurality of memory cells by forcing the read current to a corresponding third conductive line from the corresponding second conductive line. Additionally, the method can include writing a selected one of the first plurality of memory cells from a first state to a second state by forcing a write current from the corresponding second conductive line to the corresponding first conductive line and writing a selected one of the first plurality of memory cells from the second state to the first state by forcing the write current from the corresponding first conductive line to the corresponding second conductive line; and also include writing a selected one of the second plurality of memory cells from a first state to a second state by forcing the write current from the corresponding second conductive line to the corresponding third conductive line and writing a selected one of the second plurality of memory cells from the second state to the first state by forcing the write current from the corresponding third conductive line to the corresponding second conductive line.

In another set of aspects, an apparatus includes a controller circuit configured to connect to an array of memory cells each having a threshold switching selector connected in series with a magnetoresistive random access memory (MRAM) device, the array including a first plurality of memory cells each connected between a corresponding one of a first set of conductive wires and corresponding one of a second set of conductive wires and a second plurality of memory cells each connected between a corresponding one of a third set of conductive wires and corresponding one of the second set of conductive wires, the control circuit configured to: read selected ones of the first plurality of memory cells by biasing the corresponding one of the first set of conductive lines to a lower voltage than the corresponding one of the second set of conductive lines; read selected ones of the second plurality of memory cells by biasing the corresponding one of the third set of conductive lines to a lower voltage than the corresponding one of the second set of conductive lines; write selected ones of the first plurality of memory cells from a first state to a second state by biasing the corresponding one of the first set of conductive lines to a lower voltage than the corresponding one of the second set of conductive lines; write selected ones of the first plurality of memory cells from the second state to the first state by biasing the corresponding one of the first set of conductive lines to a higher voltage than the corresponding one of the second set of conductive lines; write a selected one of the second plurality of memory cells from the first state to the second state by biasing the corresponding one of the third set of conductive lines to a lower voltage than the corresponding one of the second set of conductive lines; and write a selected one of the second plurality of memory cells from the second state to the first state by biasing the corresponding one of the third set of conductive lines to a higher voltage than the corresponding one of the second set of conductive lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a non-volatile memory comprising:
      a substrate;
      one or more memory arrays formed on the substrate, each of the arrays including:
         a first set of conductive lines running in a first direction parallel to a surface of the substrate;
         a second set of conductive lines formed over the first set of conductive lines and running in a second direction parallel to the surface of the substrate;
         a third set of conductive lines formed over the second set of conductive lines and running in the first direction;
         a first plurality of memory cells each connected between a corresponding one of the first set of conductive lines and corresponding one of the second set of conductive lines, each of the first plurality of memory cells including a threshold switching selector connected in series with a magnetoresistive random access memory (MRAM) device, the MRAM device of each of the first plurality of memory cells including:
            a reference layer having a fixed magnetic field polarity; and
            a free layer connected in series with the reference layer and having a programmable magnetic field polarity, where the free layer is formed below the reference layer; and
      a second plurality of memory cells each connected between a corresponding one of the second set of conductive lines and corresponding one of the third set of conductive lines, each of the second plurality of memory cells including a threshold switching selector connected in series with an MRAM device, the MRAM device of each of the plurality of memory cells including: a reference layer having a fixed magnetic field polarity; and a free layer connected in in series with an MRAM device, the MRAM device of each of the second plurality of memory cells including:
      a reference layer having a fixed magnetic field polarity; and
      a free layer connected in series with the reference layer and having a programmable magnetic field polarity, where the free layer is formed above the reference layer.

2. The apparatus of claim 1, wherein the non-volatile memory is formed on a memory die, the apparatus further comprising:
   a control die connected to the memory die and configured to write data to and read data from the one or more memory arrays, the control die formed separately from and bonded to the memory die.

3. The apparatus of claim 1, further comprising:
one or more control circuits connected to the first, second and third sets of conductive lines, the one or more control circuits configured to:
  read selected ones of the first plurality of memory cells by biasing the corresponding one of the first set of conductive lines to a lower voltage than the corresponding one of the second set of conductive lines;
  read selected ones of the second plurality of memory cells by biasing the corresponding one of the third set of conductive lines to a lower voltage than the corresponding one of the second set of conductive lines;
  write selected ones of the first plurality of memory cells from a first state to a second state by biasing the corresponding one of the first set of conductive lines to a lower voltage than the corresponding one of the second set of conductive lines;
  write selected ones of the first plurality of memory cells from the second state to the first state by biasing the corresponding one of the first set of conductive lines to a higher voltage than the corresponding one of the second set of conductive lines;
  write a selected one of the second plurality of memory cells from the first state to the second state by biasing the corresponding one of the third set of conductive lines to a lower voltage than the corresponding one of the second set of conductive lines; and
  write a selected one of the second plurality of memory cells from the second state to the first state by biasing the corresponding one of the third set of conductive lines to a higher voltage than the corresponding one of the second set of conductive lines.

4. The apparatus of claim 3, wherein the first state is a high resistance state and the second state is a low resistance state.

5. The apparatus of claim 3, wherein the one or more control circuits include:
  a first set of drivers each connected to a corresponding one of the first set of conductive lines;
  a second set of drivers each connected to a corresponding one of the second set of conductive lines; and
  a third set of drivers each connected to a corresponding one of the third set of conductive lines,
  wherein, in reading a selected one of the first plurality of memory cells, a corresponding one of the first set of drivers connects the corresponding first conductive line to a low voltage level by an N channel device and a corresponding one of the second set of drivers connects the corresponding second conductive line to a high voltage level by a P channel device, and
  wherein, in reading a selected one of the second plurality of memory cells, a corresponding one of the third set of drivers connects the corresponding third conductive line to the low voltage level by an N channel device and a corresponding one of the second set of drivers connects the corresponding second conductive line to the high voltage level by a P channel device.

6. The apparatus of claim 5, wherein:
in reading the selected one of the first plurality of memory cells, the corresponding one of the second set of drivers is configured to drive a read current through the selected one of the first plurality of memory cells, and
in reading the selected one of the second plurality of memory cells, the corresponding one of the second set of drivers is configured to drive the read current through the selected one of the second plurality of memory cells.

7. The apparatus of claim 3, wherein the one or more control circuits are further configured to concurrently read a selected one of the first plurality of memory cells connected to a first one of the second set of conductive lines and a selected one of the second plurality of the second plurality of memory cells connected to the first one of the second set of conductive lines.

8. The apparatus of claim 3, wherein the second set of conductive lines are longer than both the first set of conductive lines and the third set of conductive lines.

9. The apparatus of claim 1, wherein in each of the first plurality of memory cells the threshold switching selector is formed below the series connected MRAM device and in each of the second plurality of memory cells the threshold switching selector is formed below the series connected MRAM device.

10. A method, comprising:
  sensing a data state of a selected one of a first plurality of memory cells by forcing a read current to a corresponding first conductive line from a second conductive line, the selected one of the first plurality of memory cells being part of an array including the first plurality of memory cells and a second plurality of memory cells, each of the first and the second pluralities of memory cells comprising a threshold switching selector connected in series with a magnetoresistive random access memory (MRAM) device;
  sensing a data state of a selected one of the second plurality of memory cells by forcing the read current to a corresponding third conductive line from the corresponding second conductive line;
  writing a selected one of the first plurality of memory cells from a first state to a second state by forcing a write current from the corresponding second conductive line to the corresponding first conductive line;
  writing a selected one of the first plurality of memory cells from the second state to the first state by forcing the write current from the corresponding first conductive line to the corresponding second conductive line;
  writing a selected one of the second plurality of memory cells from the first state to the second state by forcing the write current from the corresponding second conductive line to the corresponding third conductive line; and
  writing a selected one of the second plurality of memory cells from the second state to the first state by forcing the write current from the corresponding third conductive line to the corresponding second conductive line.

11. The method of claim 10, wherein the sensing the data state of the selected one of a first plurality of memory cells and the sensing the data state of the selected one of the second plurality of memory cells are performed concurrently.

12. The method of claim 10, wherein:
  sensing the data state of the selected one of the first plurality of memory cells by forcing the read current to the corresponding first conductive line from the second conductive line includes connecting the corresponding first conductive line to a low voltage level by an N channel device; and
  sensing the data state of the selected one of the second plurality of memory cells by forcing the read current to the corresponding third conductive line from the corresponding second conductive line includes connecting the corresponding third conductive line to the low voltage level by an N channel device.

13. An apparatus, comprising:
a controller circuit configured to connect to an array of memory cells each having a threshold switching selector connected in series with a magnetoresistive random access memory (MRAM) device, the array including a first plurality of memory cells each connected between a corresponding one of a first set of conductive lines and corresponding one of a second set of conductive lines and a second plurality of memory cells each connected between a corresponding one of a third set of conductive lines and corresponding one of the second set of conductive lines, the controller circuit configured to:
read selected ones of the first plurality of memory cells by biasing the corresponding one of the first set of conductive lines to a lower voltage than the corresponding one of the second set of conductive lines;
read selected ones of the second plurality of memory cells by biasing the corresponding one of the third set of conductive lines to a lower voltage than the corresponding one of the second set of conductive lines;
write selected ones of the first plurality of memory cells from a first state to a second state by biasing the corresponding one of the first set of conductive lines to a lower voltage than the corresponding one of the second set of conductive lines;
write selected ones of the first plurality of memory cells from the second state to the first state by biasing the corresponding one of the first set of conductive lines to a higher voltage than the corresponding one of the second set of conductive lines;
write a selected one of the second plurality of memory cells from the first state to the second state by biasing the corresponding one of the third set of conductive lines to a lower voltage than the corresponding one of the second set of conductive lines; and
write a selected one of the second plurality of memory cells from the second state to the first state by biasing the corresponding one of the third set of conductive lines to a higher voltage than the corresponding one of the second set of conductive lines.

14. The apparatus of claim 13, wherein controller circuit comprises:
a first set of drivers each configured to connect to a corresponding one of the first set of conductive lines;
a second set of drivers each configured to connect to a corresponding one of the second set of conductive lines; and
a third set of drivers each configured to connect to a corresponding one of the third set of conductive lines,
wherein, in reading a selected one of the first plurality of memory cells, a corresponding one of the first set of drivers connects the corresponding first conductive line to a low voltage level by an N channel device and a corresponding one of the second set of drivers connects the corresponding second conductive line to a high voltage level by a P channel device, and
wherein, in reading a selected one of the second plurality of memory cells, a corresponding one of the third set of drivers connects the corresponding third conductive line to the low voltage level by an N channel device and a corresponding one of the second set of drivers connects the corresponding second conductive line to the high voltage level by a P channel device.

15. The apparatus of claim 14, wherein:
in reading the selected one of the first plurality of memory cells, the corresponding one of the second set of drivers is configured to drive a read current through the selected one of the first plurality of memory cells, and
in reading the selected one of the second plurality of memory cells, the corresponding one of the second set of drivers is configured to drive the read current through the selected one of the second plurality of memory cells.

16. The apparatus of claim 14, wherein the controller circuit is further configured to concurrently read a selected one of the first plurality of memory cells connected to a first one of the second set of conductive lines and a selected one of the second plurality of the second plurality of memory cells connected to the first one of the second set of conductive lines.

17. The apparatus of claim 13, wherein the controller circuit is formed on a control die, the apparatus further comprising: a memory die including the array of memory cells, the memory die formed separately from and bonded to the control die.

18. The apparatus of claim 13, further comprising the array of memory cells, the array of memory cells comprising:
a substrate;
the first set of conductive lines, which run in a first direction parallel to a surface of the substrate;
the second set of conductive lines, which are formed over the first set of conductive lines and run in a second direction parallel to the surface of the substrate;
the third set of conductive lines, which are formed over the second set of conductive lines and run in the first direction;
the first plurality of memory cells, which are each connected between a corresponding one of the first set of conductive lines and corresponding one of the second set of conductive lines, the MRAM device of each of the first plurality of memory cells including: a reference layer having a fixed magnetic field polarity; and
a free layer connected in series with the reference layer and having a programmable magnetic field polarity, where the free layer is formed below the reference layer; and
the second plurality of memory cells, which are each connected between a corresponding one of the second set of conductive lines and corresponding one of the third set of conductive lines, the MRAM device of each of the second plurality of memory cells including:
a reference layer having a fixed magnetic field polarity: and
a free layer connected in series with the reference layer and having a programmable magnetic field polarity, where the free layer is formed above the reference layer.

19. The apparatus of claim 18, wherein the second set of conductive lines are longer than both the first set of conductive lines and the third set of conductive lines.

20. The apparatus of claim 13, wherein the first state is a high resistance state and the second state is a low resistance state.

* * * * *